(12) United States Patent
Buckley et al.

(10) Patent No.: US 11,489,067 B2
(45) Date of Patent: Nov. 1, 2022

(54) ELECTRON GAS TRANSISTOR, ONE-PIECE DEVICE COMPRISING AT LEAST TWO TRANSISTORS IN CASCODE AND ASSOCIATED MANUFACTURING METHODS

(71) Applicant: COMMISSARIAT À L'ÉNERGIE ATOMIQUE ET AUX ÉNERGIES ALTERNATIVES, Paris (FR)

(72) Inventors: Julien Buckley, Grenoble (FR); Blend Mohamad, Grenoble (FR); Florian Rigaud-Minet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 162 days.

(21) Appl. No.: 16/951,647

(22) Filed: Nov. 18, 2020

(65) Prior Publication Data

US 2021/0184027 A1 Jun. 17, 2021

(30) Foreign Application Priority Data

Nov. 20, 2019 (FR) ...................................... 1912957

(51) Int. Cl.
*H01L 29/778* (2006.01)
*H01L 27/06* (2006.01)
(Continued)

(52) U.S. Cl.
CPC ...... *H01L 29/7786* (2013.01); *H01L 27/0629* (2013.01); *H01L 29/2003* (2013.01); *H01L 29/207* (2013.01); *H01L 29/66462* (2013.01)

(58) Field of Classification Search
None
See application file for complete search history.

(56) References Cited

U.S. PATENT DOCUMENTS

| 2005/0145883 A1 | 7/2005 | Beach et al. |
| 2008/0308908 A1 | 12/2008 | Otake |
| 2021/0184027 A1* | 6/2021 | Buckley .............. H01L 29/2003 |

OTHER PUBLICATIONS

Jones, E. A., et al., "Review of Commercial GaN Power Devices and GaN-Based Converter Design Challenges," IEEE Journal of emerging and selected topics in power electronics, vol. 4, No. 3, Sep. 2016, pp. 707-719.

(Continued)

*Primary Examiner* — Jack S Chen
(74) *Attorney, Agent, or Firm* — Pillsbury Winthrop Shaw Pittman LLP

(57) ABSTRACT

Electron gas transistor of normally open type, includes a first semiconductor layer laid out along a layer plane and a second semiconductor layer formed on the first semiconductor layer and laid out along the layer plane, the first and second semiconductor layers forming an electron gas layer at the interface thereof; a third semiconductor layer with P type doping formed on the second semiconductor layer and laid out along the layer plane, a first zone with N type doping of which a part is arranged within the thickness of the third semiconductor layer, the first zone-delimiting a source zone; a second zone with N or metal type doping having at least one part arranged in the second semiconductor layer; a source electrode formed on the source zone; a drain electrode formed on the first semiconductor layer; and a gate located between the source electrode and the second zone.

24 Claims, 11 Drawing Sheets

(51) Int. Cl.
*H01L 29/20* (2006.01)
*H01L 29/207* (2006.01)
*H01L 29/66* (2006.01)

(56) References Cited

OTHER PUBLICATIONS

Search Report as issued in French Patent Application No. 1912957, dated May 20, 2020.

* cited by examiner

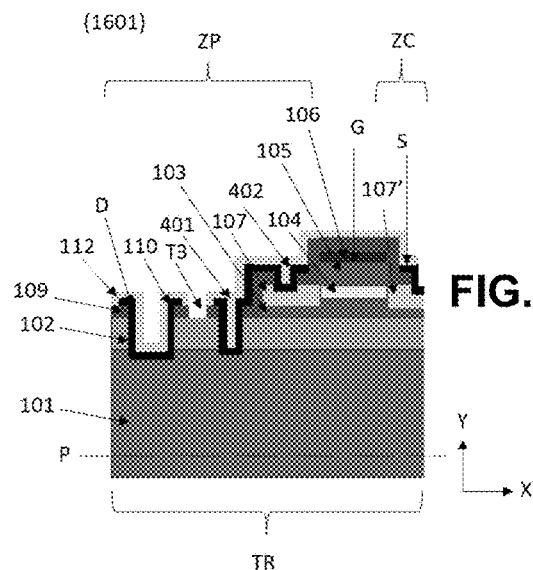
FIG.39
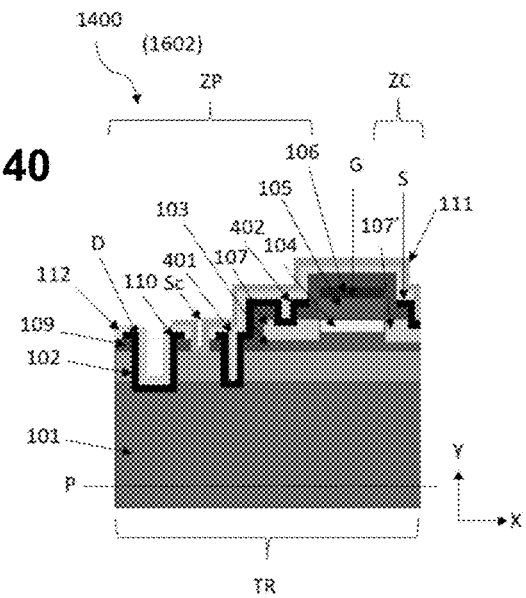
FIG.40
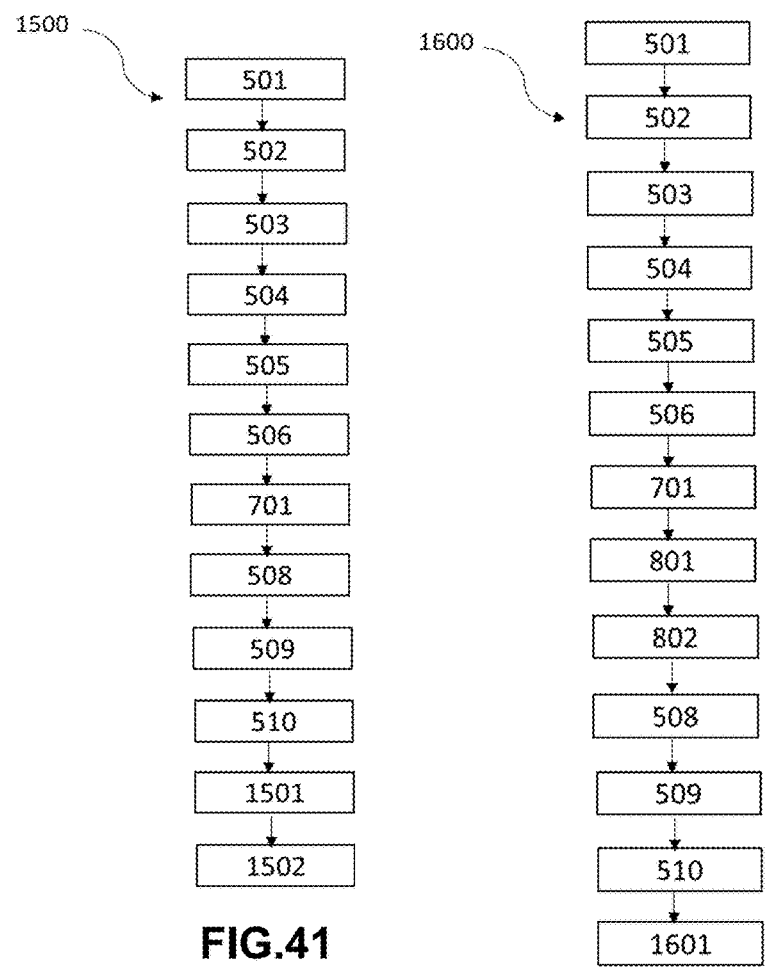
FIG.41
FIG.42

ELECTRON GAS TRANSISTOR, ONE-PIECE DEVICE COMPRISING AT LEAST TWO TRANSISTORS IN CASCODE AND ASSOCIATED MANUFACTURING METHODS

CROSS-REFERENCE TO RELATED APPLICATIONS

This application claims priority to French Patent Application No. 1912957, filed Nov. 20, 2019, the entire content of which is incorporated herein by reference in its entirety.

TECHNICAL FIELD OF THE INVENTION

The technical field of the invention is that of electron gas transistors and in particular that of electron gas transistors of normally open type.

The present invention relates to an electron gas transistor and in particular an electron gas transistor of normally open type. The present invention also relates to a one-piece device comprising at least two transistors and methods for manufacturing the one-piece device.

TECHNOLOGICAL BACKGROUND OF THE INVENTION

Numerous electronic applications henceforth require an improvement in performance, for example in onboard electronics intended for automobiles and terrestrial transports, in aeronautics, in medical systems or instead in home automation solutions. These applications require in most cases switches for high power operating in frequency ranges frequently above the megahertz.

Historically, power switches have for a long time resorted to field effect transistors based on a semiconductor channel, usually made of silicon. For lower frequencies, junction transistors were preferred because they withstand higher current densities. However, due to the relatively limited breakdown voltage of each of these transistors, power applications require the use of a large number of transistors in series, or longer transistors, which results in a higher conduction resistance. The losses through these transistors in series are considerable, not just in steady state but also during switching.

An alternative for power switches, notably at high frequencies, is the use of heterojunction field effect transistors, also designated by the term heterostructure field effect transistors. Such transistors notably include electron gas transistors.

In particular, an electron gas transistor comprises a superposition of two semiconductor layers having different band gaps which form a quantum well at the interface thereof. Electrons are confined in this quantum well to form a two-dimensional gas of electrons. For reasons of high voltage and high temperature resistance, these transistors are chosen in such a way as to have a wide energy band gap.

Among electron gas transistors with wide energy band gap, transistors based on gallium nitride GaN are very promising. Their energy band gap width induces a higher avalanche voltage compared to conventional materials used in electronics (Si, SiGe, GaAs, InP), a high rate of saturation of the carriers and good thermal and chemical stabilities (enabling use in difficult environments). The breakdown field of gallium nitride may thus be greater than $3\times10^6$ V/cm, which makes it possible to easily produce transistors with breakdown voltages greater than 100 V. In addition, such transistors enable very high current densities on account of the very high electron mobility in the interface gas.

Gallium nitride has an energy band gap width of 3.39 eV. In addition, ternary alloys such as AlGaN or InGaN can be produced easily from a machine for forming GaN by epitaxy. An electron gas transistor based on gallium nitride may also be produced on a silicon substrate (which is the basic substrate of the semiconductor industry). The GaN electron gas transistor thus has a much lower production cost than a transistor based on SiC for example. Even if a transistor based on SiC also has a wide energy band gap, ternary alloys may hardly be produced from this material, and it cannot be produced on standard silicon substrate, which makes the manufacturing cost prohibitive and greatly limits the applications thereof.

For certain applications, notably safety applications with a view to isolating a circuit in the event of malfunction of a control system, electron gas transistors of the normally open or normally closed type are used, that is to say that their threshold switching voltage is positive, such that the transistor remains blocked in the absence of control signal.

To produce a GaN electron gas transistor of the normally open type, it is known to resort to a cascode mounting or to use a particular gate architecture, as described in the document "IEEE Journal of emerging and selected topics in power electronics", E. A. Jones et al., vol. 4, no. 3, September 2016, pp. 707-719.

The cascode mounting comprises a GaN electron gas transistor normally on and a MOSFET normally open in series. Yet, such a mounting has a high resistance in the on state and requires numerous manufacturing steps, which leads to additional costs.

The document describes several gate architectures and notably a first architecture with a gate made of P doped gallium nitride GaN, a second architecture with an insulating gate with $CF_4$ plasma treatment and a third architecture with an insulating gate with an etching cutting the gas of electrons.

However, these gate architectures have drawbacks.

Indeed, the first architecture and the third architecture do not make it possible to obtain high threshold voltage values, namely at least equal to 3 V, to prevent the transistor passing into the on state in an undesired manner when the gate undergoes disruptions, and the second architecture induces a dispersion of the threshold voltages due to movements of the plasma charges.

There thus exists a need to obtain an electron gas transistor having a relatively high positive threshold voltage, not subject to dispersion of threshold voltages and with a low resistance in the on state.

SUMMARY OF THE INVENTION

The invention offers a solution to the aforementioned problems, by proposing an electron gas transistor normally open with a threshold voltage greater than 3 V which does not disperse and with low conduction resistance.

A first aspect of the invention relates to an electron gas transistor of normally open type, comprising:
- a first semiconductor layer laid out along a layer plane and a second semiconductor layer formed on the first semiconductor layer and laid out along the layer plane, the first and second semiconductor layers forming an electron gas layer at the interface thereof;
- a third semiconductor layer with P type doping formed on the second semiconductor layer and laid out along the layer plane;

at least one first zone with N type doping of which at least one part is arranged within the thickness of the third semiconductor layer, the first zone delimiting a source zone;

at least one second zone with N or metal type doping having at least one part arranged in the second semiconductor layer;

a source electrode formed on the source zone;

a drain electrode formed on the first semiconductor layer; and a gate located between the source electrode, and the second zone.

Thanks to the invention, the gate makes it possible to control the passage of current between the source electrode and the drain electrode. Indeed, the gate, either prevents in the off state, or enables in the on state, current from reaching the second zone, and thus traversing the second semiconductor layer to reach the drain electrode via the gas of electrons. The third strongly P doped semiconductor layer acts as insulator and prevents current from traversing it, which makes it possible to increase the resistance in the off state and also the threshold switching voltage. The transistor according to the invention has a threshold voltage greater than 3 V and low resistance in the on state, compared for example to the cascode mounting of the prior art.

Apart from the characteristics that have been described in the preceding paragraph, the transistor according to the invention may have one or more complementary characteristics among the following, considered individually or according to all technically possible combinations thereof.

According to an alternative embodiment, the transistor according to the invention further comprises a fourth semiconductor layer formed on the third semiconductor layer and laid out along the layer plane, the source zone and at least one part of the second zone being arranged within the thickness of the fourth semiconductor layer.

Thus, electron mobility under the gate is higher.

According to an alternative sub-embodiment of the preceding alternative embodiment, the fourth semiconductor layer is a layer of intrinsic gallium nitride GaN.

Thus, the fourth semiconductor layer does not degrade the mobility of the electrons.

According to an alternative embodiment compatible with the preceding alternative embodiment, the first semiconductor layer is a layer of gallium nitride GaN and the second semiconductor layer is a layer of aluminium gallium nitride AlGaN.

Thus, the transistor according to the invention is a GaN electron gas transistor having numerous previously described advantages.

According to an alternative sub-embodiment of the preceding alternative embodiment, the level of aluminium in the second semiconductor layer is greater than 20%.

Thus, the resistance in the on state or conduction resistance is decreased, as illustrated in FIG. 26.

According to an alternative embodiment compatible with the preceding alternative embodiments, the second semiconductor layer has a thickness greater than 20 nm.

Thus, the resistance in the on state is decreased, as illustrated in FIG. 25.

According to an alternative embodiment compatible with the preceding alternative embodiments, the third semiconductor layer is a layer of gallium nitride GaN doped with magnesium Mg with a concentration of dopants of the order of $10^{17}$ or $10^{18}$ cm$^{-3}$.

Thus, the resistance in the off state is increased, as illustrated in FIG. 27 and the risk of leakages between the source electrode and the drain electrode is decreased.

According to an alternative embodiment compatible with the preceding alternative embodiments except for the preceding alternative embodiment, the third semiconductor layer is a layer of aluminium gallium nitride AlGaN doped with magnesium Mg with a concentration of dopants of the order of $10^{17}$ or $10^{18}$ cm$^{-3}$ with a gradient of aluminium along an axis perpendicular to the layer plane, going from a first molar fraction of aluminium for the part of the third semiconductor layer in contact with the second semiconductor layer to a second molar fraction of aluminium less than the first molar fraction of aluminium.

Thus, the leakage current is decreased compared to the preceding alternative in which the third semiconductor layer is a layer of P doped gallium nitride GaN, as illustrated in FIG. 28.

According to an alternative embodiment compatible with the preceding alternative embodiments, the first zone is doped with silicon Si with a concentration of dopants of the order of $10^{19}$ cm$^{-3}$ to $10^{20}$ cm$^{-3}$ and has a thickness comprised between 10 nm and 100 nm.

Thus, electrical conductivity in the first zone is improved.

According to an alternative embodiment compatible with the preceding alternative embodiments, the second zone with N type doping is doped with silicon Si with a concentration of dopants of the order of $10^{20}$ cm$^{-3}$.

Thus, conduction in the second zone is improved to facilitate the passage of electrons.

According to an alternative embodiment compatible with the preceding alternative embodiments, the third semiconductor layer has a thickness comprised between 50 and 200 nm.

Thus, resistance in the off state is increased and the risks of leakages are decreased.

According to an alternative embodiment compatible with the preceding alternative embodiments, the second zone has at least one part arranged within the thickness of the third, second and first semiconductor layers.

Thus, electrons can traverse the second semiconductor layer via the second zone and reach the gas of electrons.

According to an alternative embodiment compatible with the preceding alternative embodiments except for the preceding alternative embodiment, a first second metal zone has at least one part arranged within the thickness of the second and first semiconductor layers and a second second metal zone situated between the source and the first second zone has at least one part arranged in a first zone.

Thus, electrons can traverse a first zone to reach the first second metal zone thanks to the second second metal zone and the second semiconductor layer via the first second zone and thus reach the gas of electrons.

A second aspect of the invention relates to a one-piece device comprising at least two transistors according to the invention, arranged in cascode.

According to an alternative embodiment, the one-piece device further comprises a Schottky diode integrated in parallel with each transistor.

Thus, the voltage from which current can flow between the source and the drain of each transistor is lower.

The device according to the invention has four embodiments without Schottky diodes, corresponding to the first, second, third and fourth embodiments, and four embodiments with Schottky diodes, corresponding to the fifth, sixth, seventh and eighth embodiments.

The fifth and sixth embodiments may be obtained from the first and second embodiments, the seventh embodiment may be obtained from the third embodiment and the eighth embodiment may be obtained from the fourth embodiment.

In the first, the second, the fifth and the sixth embodiments, the source electrode is between the gate and the drain electrode. Thus, the electric field under the gate is lower in the off state because it is concentrated between the source electrode and the drain electrode. The device is also more compact compared to the devices of the third, fourth, seventh and eighth embodiments in which the gate is between the source electrode and the drain electrode and the source electrode is common to the two transistors.

A third aspect of the invention relates to a method for manufacturing a device according to the invention comprising the following steps:
depositing along a layer plane, a first, then a second, then a third semiconductor layer, then a gate insulating layer and then a gate metal layer;
etching the gate insulating layer and the gate metal layer so as to obtain two first parallel and non-merged lines in the layer plane;
doping at least the third semiconductor layer at the level of peripheral zones situated on either side of the two first lines and laid out along the layer plane;
doping at least the third semiconductor layer at the level of a central zone situated between the two first lines and laid out along the layer plane;
etching the peripheral zones with stoppage on the second semiconductor layer so as to conserve a second line along each first line;
depositing an electrode insulating layer along the layer plane;
etching two second parallel trenches with stoppage on or in the first semiconductor layer in the peripheral zones situated on either side of the two second lines, the second lines being between the two second trenches;
depositing an electrode metal layer along the layer plane;
etching, called electrode etching, the electrode metal layer so as to conserve at least the electrode metal layer at the level of the second trenches.

The method according to the invention has eight embodiments, one embodiment per embodiment of the device according to the invention that it manufactures. The eight embodiments of the method have the steps described previously. Each second trench is intended to constitute a drain electrode and each first line, a gate.

According to a first alternative embodiment, the method according to the invention further comprises an etching of a first trench in the electrode insulating layer at the level of each second line, the electrode etching conserving the electrode metal layer at the level of the two first trenches.

This first alternative embodiment relates to the first, second, fifth and sixth embodiments of the method respectively making it possible to manufacture the device according to the first, the second, the fifth and the sixth embodiments. Each first trench is intended to constitute a source electrode.

According to a first alternative sub-embodiment of the preceding first alternative embodiment, the method according to the invention further comprises the following steps:
etching a primary trench in the central zone before the step of depositing the electrode insulating layer;
etching a secondary trench in the primary trench with stoppage in the first semiconductor layer after the step of depositing the electrode insulating layer,
etching at least two tertiary trenches in the central zone on either side of the primary trench after the step of depositing the electrode insulating layer;
the electrode etching conserving the electrode metal layer at the level of the primary, secondary and tertiary trenches.

This alternative sub-embodiment relates to the second, the fifth and the sixth embodiments of the method. The primary, secondary and tertiary trenches are intended to constitute a second metal zone.

According to a second alternative embodiment, the method according to the invention further comprises, after the step of depositing the electrode insulating layer, an etching of a first trench in the central zone, the electrode etching conserving the electrode metal layer at the level of the first trench.

This second alternative embodiment relates to the third, fourth, seventh and eighth embodiments of the method respectively making it possible to manufacture the device according to the third, the fourth, the seventh and the eighth embodiments. The first trench is intended to constitute the source electrode common to the two transistors according to the invention.

According to a first alternative sub-embodiment of the second alternative embodiment, the method according to the invention further comprises the following steps, after the step of depositing the electrode insulating layer:
etching a primary trench in the electrode insulating layer at the level of each second line;
etching a secondary trench with stoppage on the first semiconductor layer along each second line,
the electrode etching conserving the electrode metal layer at the level of the two primary trenches and two secondary trenches.

This alternative sub-embodiment relates to the fourth and the eighth embodiments of the method. The primary trenches are intended to constitute a first second metal zone and the secondary trenches, a second second metal zone, the first second metal zone making it possible to facilitate the conveyance of electrons to the second second metal zone making it possible to traverse the second semiconductor layer to join the gas of electrons.

According to a second alternative sub-embodiment of the first alternative embodiment compatible with the first alternative sub-embodiment of the first alternative embodiment, the method according to the invention further comprises, after the step of depositing the electrode insulating layer, a step of etching two third parallel trenches in the electrode insulating layer, in the peripheral zones situated on either side of the two second lines, the second lines being between the two third trenches, the second trenches being etched in such a way that the third trenches are between the second trenches, the electrode etching further conserving the electrode metal layer between each third trench and the closest first trench and after the step of electrode etching, the following steps:
depositing a diode metal layer along the layer plane;
etching the diode metal layer so as to conserve at least the diode metal layer at the level of each third trench and between each third trench and the closest first trench.

This second alternative sub-embodiment relates to the fifth embodiment of the method making it possible to manufacture the device according to the fifth embodiment. Each third trench covered with the diode metal layer and the part covered with the diode metal layer and with the electrode metal layer between each third trench and the closest first trench constitutes a Schottky diode.

According to a third alternative sub-embodiment of the first alternative embodiment compatible with the first alternative sub-embodiment of the first alternative embodiment, the method according to the invention further comprises, after the step of depositing the electrode insulating layer, the following steps:

etching two third parallel trenches in the electrode insulating layer in the peripheral zones situated on either side of the two second lines, the second lines being between the two third trenches, then depositing a diode metal layer along the layer plane;

etching the diode metal layer so as to conserve at least the diode metal layer at the level of each third trench, between each third trench and the closest second line and at the level of each second line, then depositing a diode insulating layer along the layer plane;

the second trenches being etched in such a way that the third trenches are between the second trenches, the electrode etching further conserving the electrode metal layer at the level of each third trench and between each third trench and the closest first trench.

This third alternative sub-embodiment relates to the sixth embodiment of the method making it possible to manufacture the device according to the sixth embodiment. Each third trench and the part covered with the diode metal layer and with the electrode metal layer between each third trench and the closest first trench constitutes a Schottky diode.

According to a second alternative sub-embodiment of the second alternative embodiment, the method according to the invention further comprises, after the step of electrode etching, the following steps:

etching two third parallel trenches, each third trench being etched at the level of a second line;

depositing a diode metal layer along the layer plane and etching the diode metal layer so as to conserve at least the diode metal layer at the level of each second line, between each third trench and the first trench, and at the level of the first trench.

This second alternative sub-embodiment relates to the seventh embodiment of the method making it possible to manufacture the device according to the seventh embodiment. Each third trench and the part covered with the diode metal layer between each third and the first trench constitutes a Schottky diode.

According to an alternative embodiment of the first alternative sub-embodiment of the second alternative embodiment, the method according to the invention further comprises, after the step of electrode etching, the following steps:

depositing a diode insulating layer along the layer plane and etching two third parallel trenches, each third trench being etched between a second trench and a secondary trench, the first trench lying between the two third trenches;

depositing a diode metal layer along the layer plane and etching the diode metal layer so as to conserve at least the diode metal layer at the level of each third trench, between each third trench and the first trench and at the level of the first trench.

This alternative embodiment relates to the eighth embodiment of the method making it possible to manufacture the device according to the eighth embodiment. Each third trench and the part covered with the diode metal layer between each third trench and the first trench constitutes a Schottky diode.

The invention and the different applications thereof will be better understood on reading the description that follows and by examining the figures that accompany it.

BRIEF DESCRIPTION OF THE FIGURES

The figures are presented for indicative purposes and in no way limit the invention.

FIG. 39 illustrates the thirteenth step of an eighth embodiment of the method according to the invention.

FIG. 40 illustrates the fourteenth step of an eighth embodiment of the method according to the invention.

FIG. 41 is a synoptic diagram illustrating the steps of the seventh embodiment of the method according to the invention.

FIG. 42 is a synoptic diagram illustrating the steps of the eighth embodiment of the method according to the invention.

DETAILED DESCRIPTION

Unless stated otherwise, a same element appearing in the different figures has a single reference.

A first aspect of the invention relates to an electron gas transistor, of normally open type, that is to say with a positive switching threshold voltage.

"Switching threshold voltage" is taken to mean the voltage to apply between the gate and the source of the transistor so that it passes from an off state to an on state.

Figure 24:
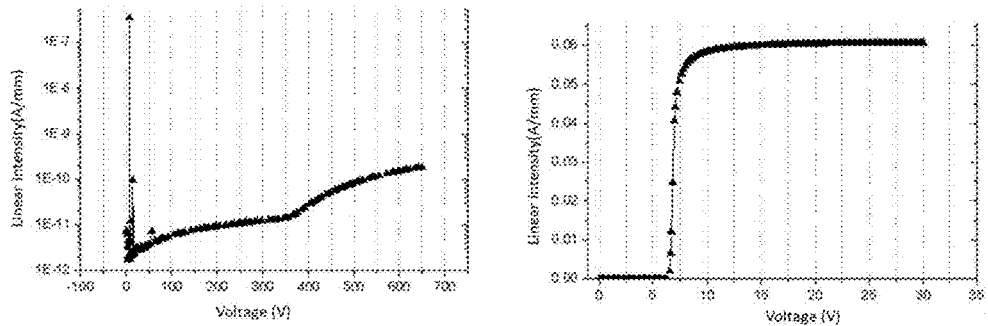
FIG. 24 represents the characteristics of an electron gas transistor in an off state (on the left) and in an on state (on the right).

FIG. 24 represents the characteristic of an electron gas transistor in an off state on the left and the characteristic of the same electron gas transistor in an on state on the right.

In the off state, the intensity traversing the transistor is very low compared to the intensity traversing the transistor in the on state, of the order of $10^{10}$ times lower, for higher voltages, of the order of ten times higher. In the off state, the transistor thus has a very high resistance blocking the current and in the on state, a low resistance enabling the conduction of current.

A second aspect of the invention relates to a one-piece device comprising at least two transistors in cascode, that is to say two transistors in series traversed by the same current.

Figure 11:
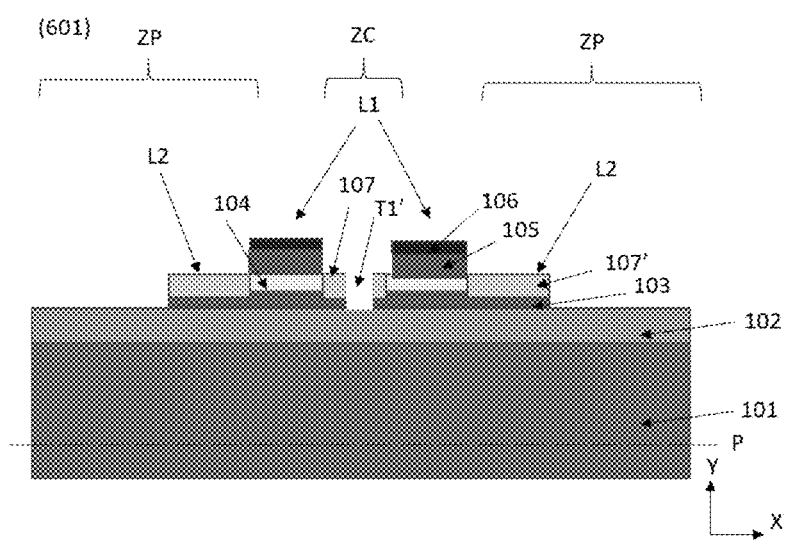
FIG. 11 illustrates the seventh step of the second embodiment of the method according to the invention.

FIG. 11 shows a schematic representation of a first embodiment of the device 100 according to the invention.

Figure 14:
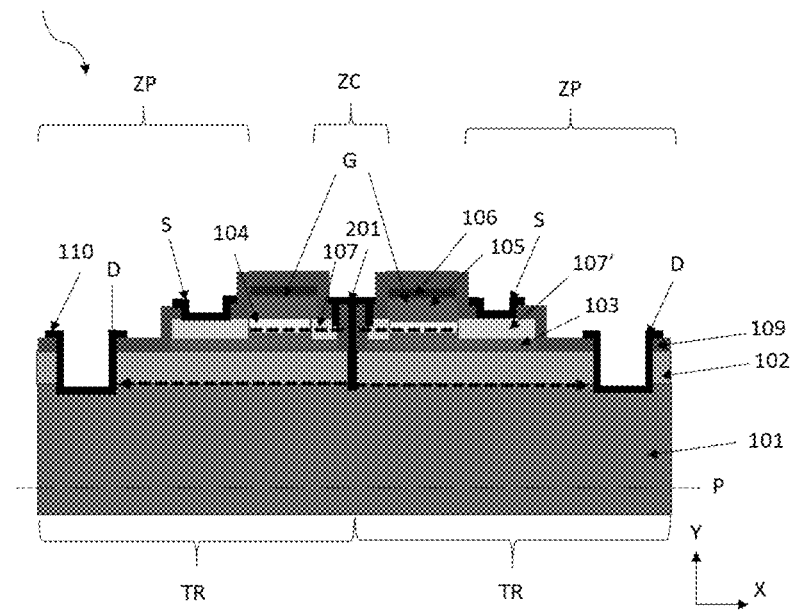
FIG. 14 shows a schematic representation of the second embodiment of the device according to the invention.

FIG. 14 shows a schematic representation of a second embodiment of the device 200 according to the invention.

Figure 16:
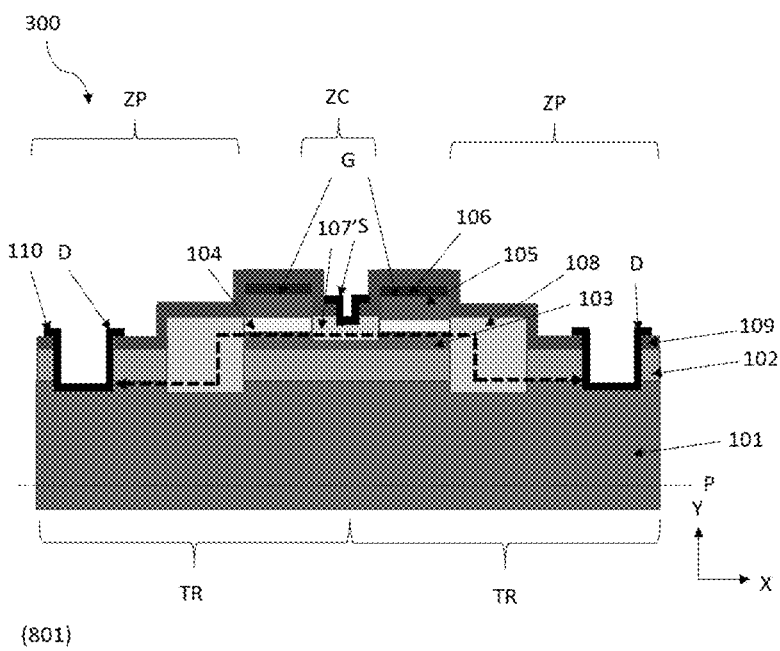
FIG. 16 shows a schematic representation of the third embodiment of the device according to the invention.

FIG. 16 shows a schematic representation of a third embodiment of the device 300 according to the invention.

Figure 19:
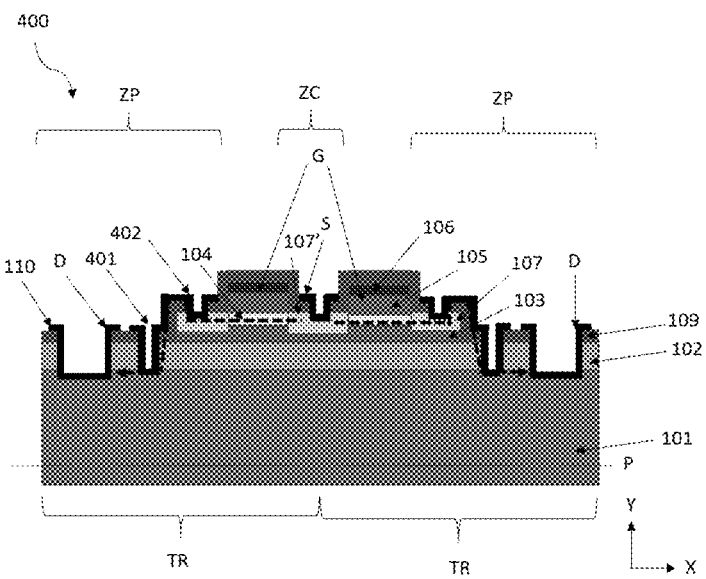
FIG. 19 shows a schematic representation of the fourth embodiment of the device according to the invention.

FIG. 19 shows a schematic representation of a fourth embodiment of the device 400 according to the invention.

Whatever the embodiment, the device 100, 200, 300, 400 according to the invention comprises at least two transistors TR symmetrical with respect to a plane perpendicular to a layer plane P and comprising a vertical axis Y. The layer plane P comprises a horizontal axis X and is perpendicular to the vertical axis Y.

In the interests of simplicity, FIGS. 29 to 34 and 37 to 40 only represent one transistor TR of the device, the complete device being able to be obtained by axial symmetry.

In the remainder of the description, "thickness of a layer" is taken to mean the dimension of the layer along the vertical direction Y perpendicular to the layer plane P.

Each transistor TR comprises at least:
- a first semiconductor layer 101 laid out along the layer plane P;
- a second semiconductor layer 102 formed on the first semiconductor layer 101 and laid out along the layer plane P;
- a third semiconductor layer 103 formed on the second semiconductor layer 102 and laid out along the layer plane P;
- at least one first zone 107, 107' with N type doping, one of the first zones 107 delimiting a source zone 107';
- at least one second zone 108, 201, 401, 402 with N or metal type doping;
- a source electrode S;
- a drain electrode D;
- a gate G, the semiconductor layers 101, 102, 103 being common to the two transistors TR of the device 100, 200, 300, 400.

The gas of electrons characteristic of electron gas transistors is formed at the interface between the first semiconductor layer 101 and the second semiconductor layer 102.

The first semiconductor layer 101 is for example made of gallium nitride GaN and the second semiconductor layer 102 made of aluminium gallium nitride AlGaN.

The level of aluminium in the second semiconductor layer 102 is for example greater than 20%.

The first semiconductor layer 101 has for example a thickness comprised between 50 nm and 300 nm and the second semiconductor layer 102 has for example a thickness greater than 20 nm.

The third semiconductor layer 103 has a P type doping.

The third semiconductor layer 103 is for example gallium nitride GaN doped with magnesium Mg with a concentration of dopants of the order of $10^{17}$ or $10^{18}$ cm$^{-3}$.

The third semiconductor layer 103 is for example aluminium gallium nitride AlGaN with a gradient of aluminium along the vertical axis Y perpendicular to the layer plane P, doped with magnesium Mg with a concentration of dopants of the order of $10^{17}$ or $10^{18}$ cm$^{-3}$.

The molar fraction of aluminium for the lower part of the third semiconductor layer 103 in contact with the second semiconductor layer 102, or first molar fraction of aluminium, is less than the molar fraction of aluminium for the upper part of the third semiconductor layer 103, or second molar fraction of aluminium.

The first molar fraction of aluminium is for example of the order of the molar fraction of aluminium of the second semiconductor layer 102. The first molar fraction of aluminium is preferentially equal to the molar fraction of aluminium of the second semiconductor layer 102.

The second molar fraction of aluminium is for example zero.

The third semiconductor layer 103 is then produced by known techniques, for example by epitaxial growth.

The third semiconductor layer 103 has for example a thickness comprised between 25 and 100 nm, more particularly between 50 and 100 nm.

Each first zone 107, 107' has at least one part arranged within the thickness of the third semiconductor layer 103, in other words a part of the third semiconductor layer 103 has an N type doping.

Each first zone 107, 107' is for example doped with silicon Si or germanium Ge, for example with a concentration of dopants of the order of $10^{19}$ cm$^{-3}$ to $10^{20}$ cm$^{-3}$.

The first zone 107, 107' has for example a thickness of 20 nm to 70 nm.

In the first and the third embodiments, each transistor TR of the device 100, 300 comprises a single first zone 107, 107' delimiting the source zone 107' and in the second and the fourth embodiments, each transistor TR of the device 200, 400 comprises two first zones 107, 107' of which one delimits the source zone 107'.

The source electrode S is formed on the source zone 107'.

The drain electrode D is formed on or in the first semiconductor layer 101.

The gate G is formed on a part of the third semiconductor layer 103 not N doped, that is to say not forming part of a first zone 107.

Each transistor TR may also comprise a fourth semiconductor layer 104 formed on the third semiconductor layer 103 and laid out along the layer plane P.

In this case:
  each first zone 107 is arranged within the thickness of the fourth semiconductor layer 104, that is to say that at the level of each first zone 107, 107', all the fourth semiconductor layer 104 is N doped;
  the gate G is formed on a part of the fourth semiconductor layer 104 not forming part of a first zone 107, 107' and thus on the part of the third semiconductor layer 103 on which is formed the part of the fourth semiconductor layer 104.

The fourth semiconductor layer 104 is for example made of intrinsic gallium nitride GaN.

The fourth semiconductor layer 104 may also be doped, with a concentration of dopants of the order of $10^{14}$ or $10^{15}$ cm$^{-3}$.

According to a first embodiment of the transistor TR according to the invention, the transistor TR comprises a single second zone 108 with N type doping with a concentration of dopants greater than that of the first zone 107.

The second zone 108 is for example doped with silicon Si, for example with a concentration of the order of $10^{20}$ cm$^{-3}$.

According to the first embodiment of the transistor TR, the second zone 108 has at least one part arranged within the thickness of the third semiconductor layer 103, the second semiconductor layer 102 and in a part of the thickness of the first semiconductor layer 101, that is to say that at the level of the second zone 108, all the third semiconductor layer 103, all the second semiconductor layer 102 and a part of the first semiconductor layer 101 are N doped.

If the transistor TR according to the first embodiment comprises the fourth semiconductor layer 104, the second zone 108 is arranged within the thickness of the fourth semiconductor layer 104, that is to say that at the level of the second zone 108, all the fourth semiconductor layer 104 is N doped.

The device 100 according to a first embodiment and the device 300 according to a third embodiment comprise transistors TR according to the first embodiment.

According to a second embodiment of the transistor TR according to the invention, the transistor TR comprises at least one second metal zone 201, 401, 402.

The device 200 according to a second embodiment and the device 400 according to a fourth embodiment comprise transistors TR according to the second embodiment.

In the second embodiment of the device 200 according to the invention, each transistor TR comprises a single second zone 201.

The second zone 201 is arranged within the thickness of the third semiconductor layer 103, the second semiconductor layer 102 and in a part of the thickness of the first semiconductor layer 101, that is to say that at the level of the second zone 201, all the third semiconductor layer 103, all the second semiconductor layer 102 and a part of the first semiconductor layer 101 have a metal part.

If the transistor TR comprises the fourth semiconductor layer 104, the second zone 201 is arranged within the thickness of the fourth semiconductor layer 104, that is to say that at the level of the second zone 201, all the fourth semiconductor layer 104 has a metal part.

In the fourth embodiment of the device 400 according to the invention, each transistor TR comprises two second zones 401, 402.

A first second zone 401 is arranged within the thickness of the second semiconductor layer 102 and in a part of the thickness of the first semiconductor layer 101, that is to say that at the level of the second zone 401, all the second semiconductor layer 102 and a part of the first semiconductor layer 101 have a metal part, and a second second zone 402 has at least one part in contact with a first zone 107, 107' situated between the source S and the first second zone 401.

In the transistor TR, the gate G is situated between the source electrode S and the second zone 108, 201, 401, 402.

A third aspect of the invention relates to a method for manufacturing a device 100, 200, 300, 400 according to the invention.

Figure 20:
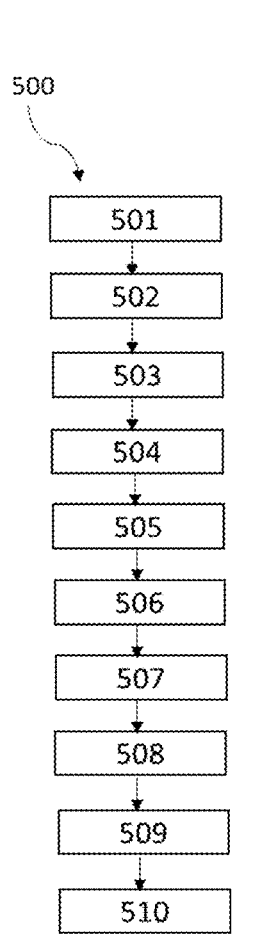
FIG. 20 is a synoptic diagram illustrating the steps of the first embodiment of the method according to the invention.

FIG. 20 is a synoptic diagram illustrating the steps of a first embodiment of the method 500 according to the invention, making it possible to manufacture the device 100 according to the first embodiment.

Figure 21:
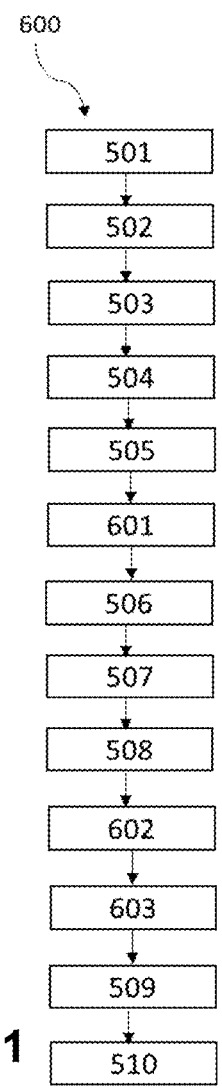
FIG. 21 is a synoptic diagram illustrating the steps of the second embodiment of the method according to the invention.

FIG. 21 is a synoptic diagram illustrating the steps of a second embodiment of the method 600 according to the invention, making it possible to manufacture the device 200 according to the second embodiment.

Figure 22:
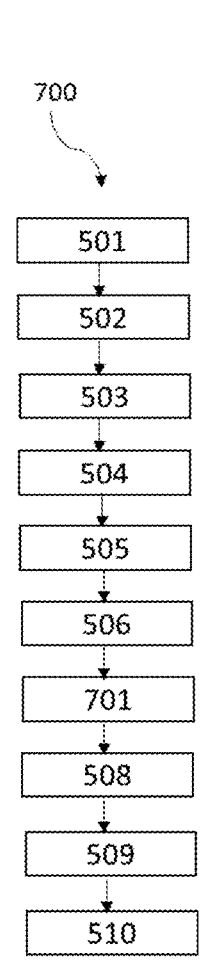
FIG. 22 is a synoptic diagram illustrating the steps of the third embodiment of the method according to the invention.

FIG. 22 is a synoptic diagram illustrating the steps of a third embodiment of the method 700 according to the invention, making it possible to manufacture the device 300 according to the third embodiment.

Figure 23:
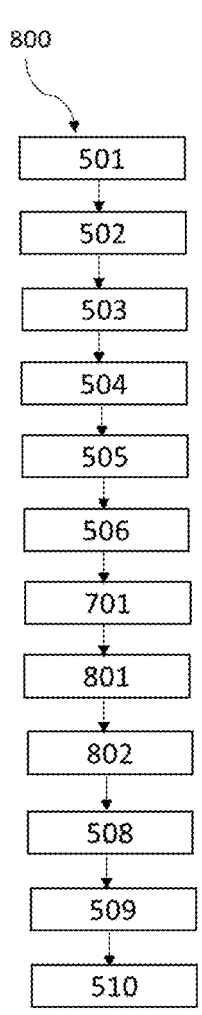
FIG. 23 is a synoptic diagram illustrating the steps of the fourth embodiment of the method according to the invention.

FIG. 23 is a synoptic diagram illustrating the steps of a fourth embodiment of the method 800 according to the invention, making it possible to manufacture the device 400 according to the fourth embodiment.

Figure 1:
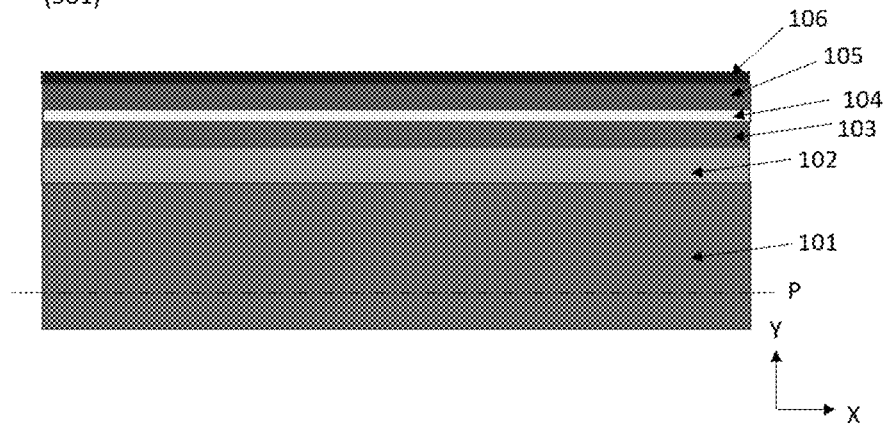
FIG. 1 illustrates the first step of the first embodiment of the method according to the invention.

FIG. 1 illustrates a first step 501 of the first embodiment of the method 500 according to the invention whatever the embodiment.

The first step 501 consists in depositing on a substrate not represented, along the layer plane P, the first semiconductor layer 101, the second semiconductor layer 102, the third semiconductor layer 103, optionally the fourth semiconductor layer 104, a gate insulating layer 105 and a gate metal layer 106 in this order.

In FIGS. 1 to 23, the device 100, 200, 300, 400 is represented with the optional fourth semiconductor layer 104.

The deposition is for example carried out by epitaxy, by CVD (Chemical Vapor Deposition) or instead by ALD (Atomic Layer Deposition).

The gate insulating layer 105 has for example a thickness comprised between 10 nm and 80 nm and the gate metal layer 106 has for example a thickness comprised between 10 nm and 200 nm.

The gate insulating layer 105 is for example made of silicon nitride SiN or made of $Al_2O_3$ or $HfO_2$ and the gate metal layer 106 is for example made of TiN or P type doped Al poly-Si.

Figure 2:
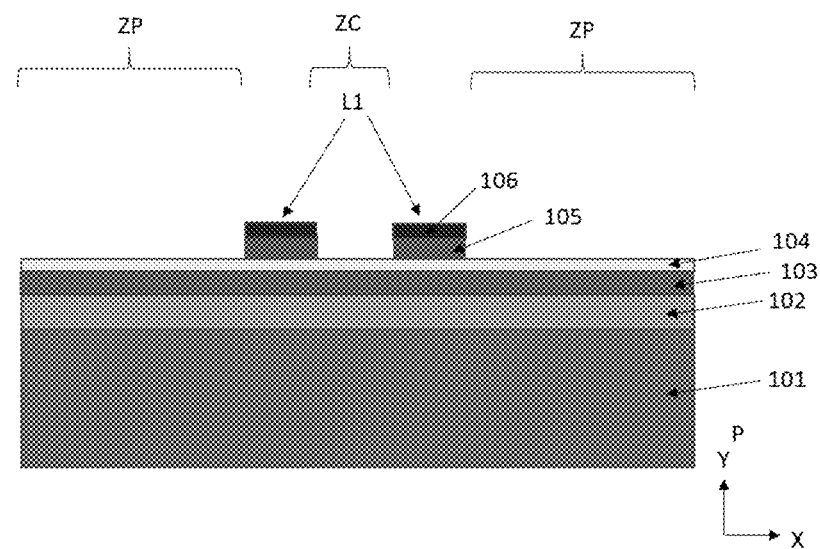
FIG. 2 illustrates the second step of the first embodiment of the method according to the invention.

FIG. 2 illustrates a second step 502 of the method 500, 600, 700, 800 according to the invention whatever the embodiment.

The second step 502 consists in etching the gate insulating layer 105 and the gate metal layer 106 with stoppage on the fourth semiconductor layer 104, or failing this with stoppage on the third semiconductor layer 103, so as to obtain two first parallel and non-merged lines L1 in the layer plane P.

The etching is for example carried out by fluorine plasma dry etching.

The first lines L1 are for example spaced apart from each other by 50 nm to 0.5 μm and have a width of 100 nm to 1 μm.

Figure 3:
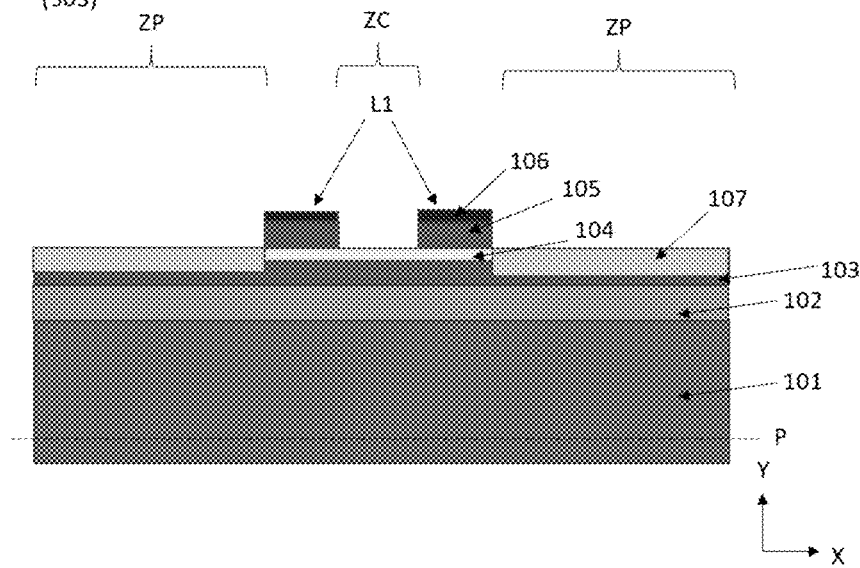
FIG. 3 illustrates the third step of the first embodiment of the method according to the invention.

FIG. 3 illustrates a third step 503 of the method 500, 600, 700, 800 according to the invention whatever the embodiment.

The third step 503 consists in doping peripheral zones ZP situated on either side of the two first lines L1 comprising the parts of the fourth semiconductor layer 104, or failing this the third semiconductor layer 103, laid bare at the second step 502.

"Parts situated on either side of two lines" is taken to mean the parts that are not situated between the two lines or on the two lines.

The doping is for example carried out by ion implantation of a dose of $2\times10^{15}$ $cm^2$ at 40 keV. It is then followed by a high temperature annealing at 1000° C. or above for around 30 min.

In the first, second and fourth embodiments of the method 500, 600, 800, the third step 503 enables the creation of the first zones 107.

In the third embodiment of the method 700, the third step 503 enables the creation of the second zones 108 with N type doping.

The characteristics of the doping of the third step 503 are thus different according to the embodiment of the method 500, 600, 700, 800. Thus, in the third embodiment of the method 700, the implanted dose will be greater than the implanted dose in the first, second and fourth embodiments.

In FIG. 3, the doping carried out enables the creation of the first zones 107.

Figure 4:
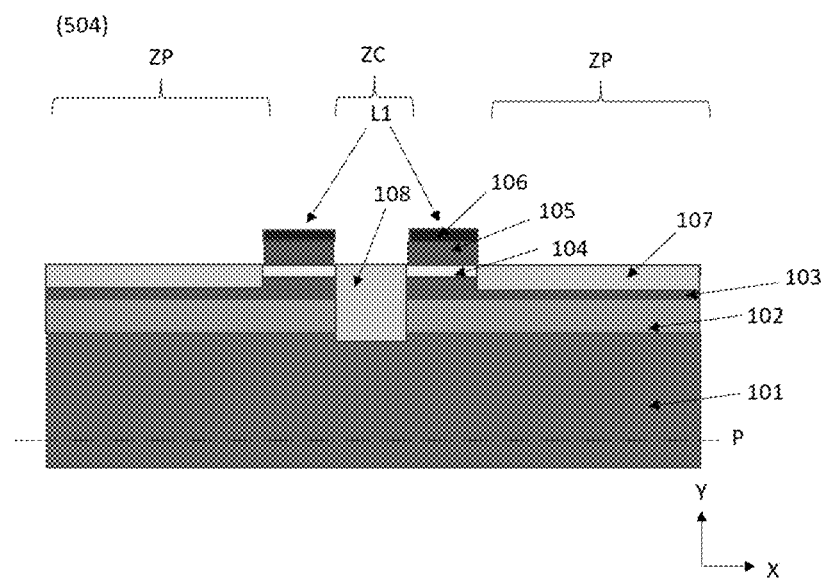
FIG. 4 illustrates the fourth step of the first embodiment of the method according to the invention.

FIG. 4 illustrates a fourth step 504 of the method 500, 600, 700, 800 according to the invention whatever the embodiment.

The fourth step 504 consists in doping a central zone ZC situated between the two first lines L1 comprising the parts of the fourth semiconductor layer 104 laid bare at the second step 502.

The doping is for example carried out by ion implantation. It is then followed by an annealing.

In the second, third and fourth embodiments of the method 600, 700, 800, the fourth step 504 enables the creation of the first zones 107.

In the first embodiment of the method 500, the fourth step 504 enables the creation of a second zone 108 with N type doping.

The characteristics of the doping of the fourth step 504 are thus different according to the embodiment of the method 500, 600, 700, 800 according to the invention. Thus, in the first embodiment of the method 500, the implanted dose will be greater than the implanted dose in the second, third and fourth embodiments.

In FIG. 4, the doping carried out enables the creation of a second zone 108 with N type doping.

Figure 5:
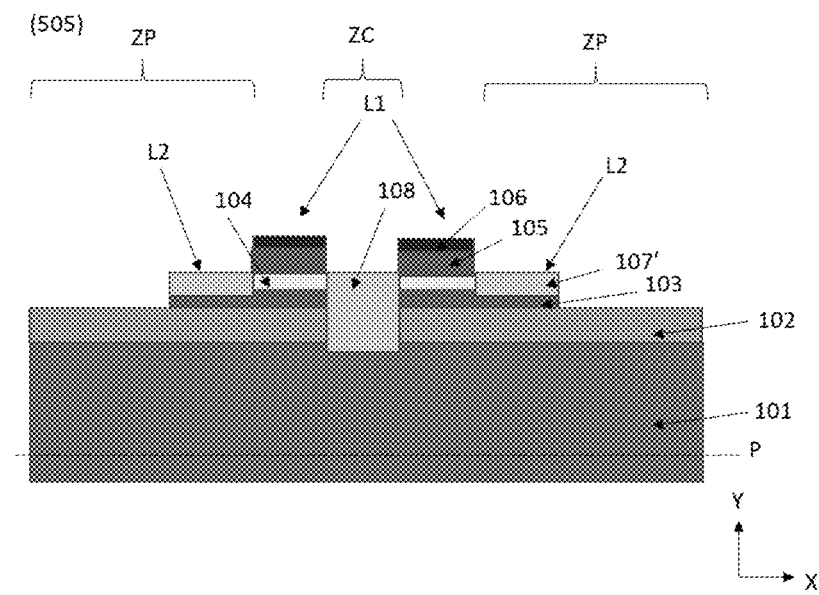
FIG. 5 illustrates the fifth step of the first embodiment of the method according to the invention.

FIG. 5 illustrates a fifth step 505 of the method 500, 600, 700, 800 according to the invention whatever the embodiment.

The fifth step 505 consists in etching the parts of the fourth semiconductor layer 104, and/or failing this, of the third semiconductor layer 103, doped during the third step 503, that is to say the peripheral zones ZP, with stoppage on the second semiconductor layer 102, so as to conserve two second lines L2 along the two first lines L1. The second lines L2 are thus parallel with each other and parallel to the first lines L1 in the layer plane P.

The etching is for example carried out by fluorine plasma dry etching.

The second lines L2 are for example spaced apart by 250 nm to 3 μm and have a width of 1 μm to 10 μm.

Figure 6:
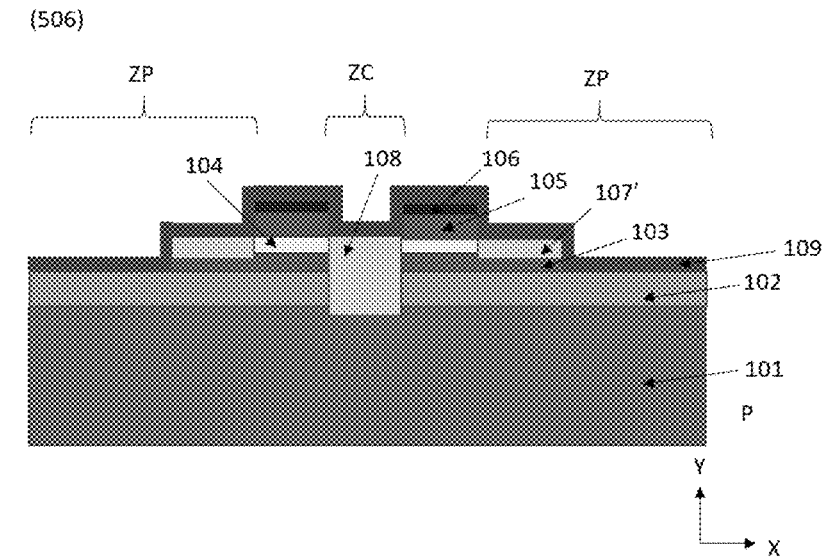
FIG. 6 illustrates the sixth step of the first embodiment of the method according to the invention.

FIG. 6 illustrates a sixth step 506 of the method 500, 700, 800 according to the first, third and fourth embodiments.

The sixth step 506 consists in depositing an electrode insulating layer 109 along the layer plane P.

The electrode insulating layer 109 is for example made of silicon nitride SiN and has for example a thickness of 30 nm.

The electrode insulating layer 109 is for example obtained by LPCVD of a layer of SiN.

FIG. 11 The sixth step 506 is also carried out in the method 600 according to the second embodiment but it is preceded by a step 601 illustrated in FIG. 11.

Step 601 illustrated in FIG. 11 consists in etching a primary trench T1' with stoppage on the second semiconductor layer 102, in the parts laid bare at the second step 502 and situated between the two first lines L1, that is to say in the central zone ZC. The primary trench T1' is parallel to the first lines L1 in the layer plane P.

The primary trench T1' is etched in such a way that the edges of this primary trench T1' are substantially of same height and that the sides of the primary trench T1' are comprised in planes orthogonal to the bottom of the primary trench T1' and substantially parallel with each other.

The etching following a step of photo-lithography may be carried out by fluorine plasma dry etching.

The primary trench T1' has for example a width of 0.5 μm to 9 μm.

Figure 7:
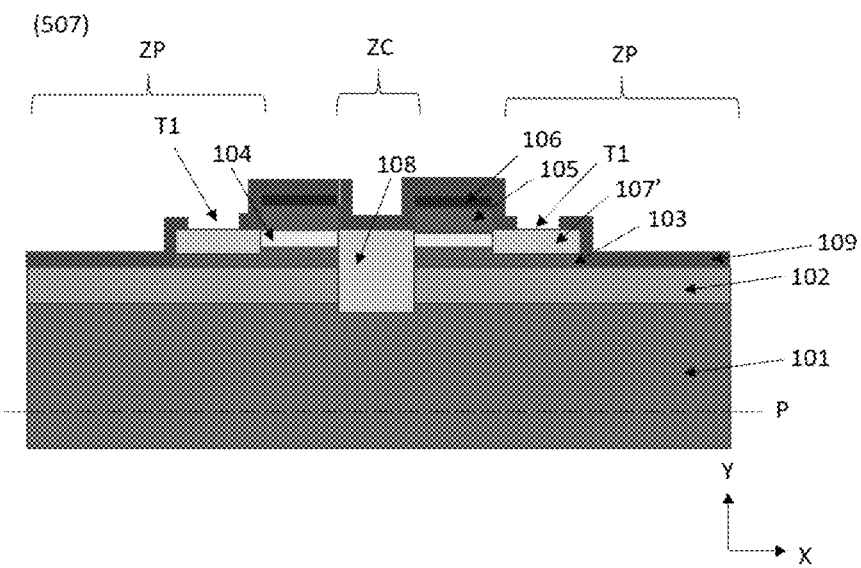
FIG. 7 illustrates the seventh step of the first embodiment of the method according to the invention.

FIG. 7 illustrates a seventh step 507 of the method 500 according to the first embodiment.

The seventh step 507 consists in etching two first trenches T1, a first trench T1 in each second line L2, with stoppage on the fourth semiconductor layer 104, or failing this with stoppage on the third semiconductor layer 103. The first trenches T1 are parallel to the first lines L1 in the layer plane P.

The first trenches T1 are parallel with each other. A first trench T1 is etched in such a way that the edges of this first trench T1 are substantially of same height and that the sides of the first trench T1 are comprised in planes orthogonal to the bottom of the first trench T1 and substantially parallel with each other. The etching depth is substantially the same for the two first trenches T1.

The etching following a step of photo-lithography may be carried out by fluorine plasma dry etching.

The two first trenches T1 have for example a width of 0.5 µm to 10 µm.

The seventh step 507 is also carried out in the method 600 according to the second embodiment after the sixth step 506.

The seventh step 507 is not carried out in the method 700, 800 according to the third and fourth embodiments. A seventh bis step is carried out instead.

Figure 15:
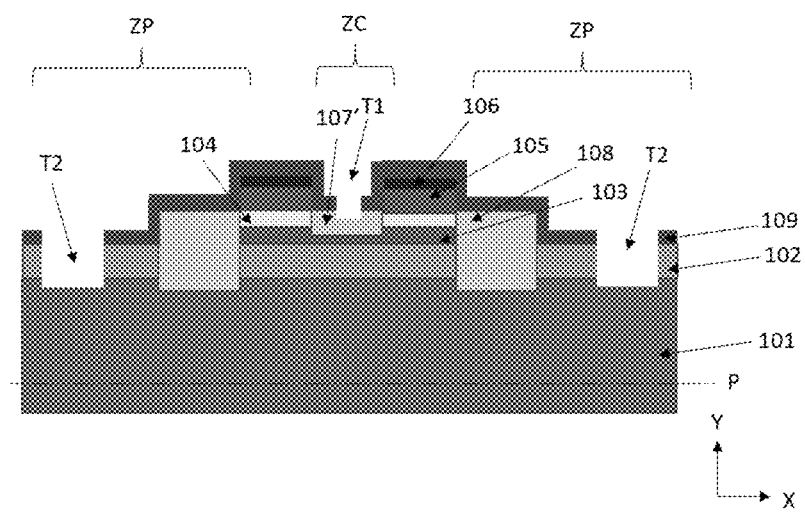
FIG. 15 illustrates the seventh step of the third and fourth embodiments of the method according to the invention.

FIG. 15 illustrates the seventh bis step 701 of the method 700, 800 according to the third and fourth embodiments.

The seventh bis step 701 consists in etching a first trench T1 in the parts of the fourth semiconductor layer 104, or failing this of the third semiconductor layer 103, laid bare at the second step 502 situated between the two first lines L1, that is to say in the central zone ZC. The first trench T1 is parallel to the first lines L1 in the layer plane P.

The first trench T1 is etched in such a way that the edges of this first trench T1 are substantially of same height and that the sides of the first trench T1 are comprised in planes orthogonal to the bottom of the first trench T1 and substantially parallel with each other.

The etching following a step of photo-lithography may be carried out by fluorine plasma dry etching.

The first trench T1 has for example a width of 0.5 µm to 10 µm.

Figure 8:
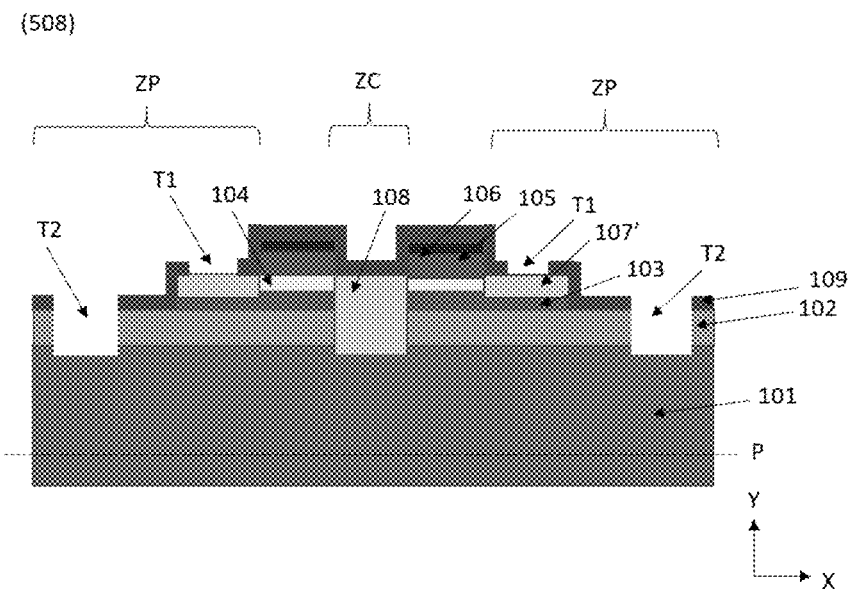
FIG. 8 illustrates the eighth step of the first embodiment of the method according to the invention.

FIG. 8 illustrates an eighth step 508 of the method 500 according to the first embodiment.

The eighth step 508 consists in etching two second parallel trenches T2 with stoppage on the first semiconductor layer 101 in the parts of the peripheral zones ZP situated on either side of the two second lines L2, the two second trenches T2 being separated by the two second lines L2. The second trenches T2 are parallel to the first lines L1 in the layer plane P.

The second trenches T2 are parallel with each other. A second trench T2 is etched in such a way that the edges of this second trench T2 are substantially of same height and that the sides of the second trench T2 are comprised in planes orthogonal to the bottom of the second trench T2 and substantially parallel with each other. The etching depth is substantially the same for the two second trenches T2.

The etching following a step of photo-lithography may be carried out by fluorine plasma dry etching.

The two second trenches T2 have for example a width of 0.5 µm to 10 µm.

The eighth step 508 is also carried out in the method 600 according to the second embodiment after the seventh step 507 and in the method 700 according to the third embodiment after the seventh bis step 701.

Figure 17:
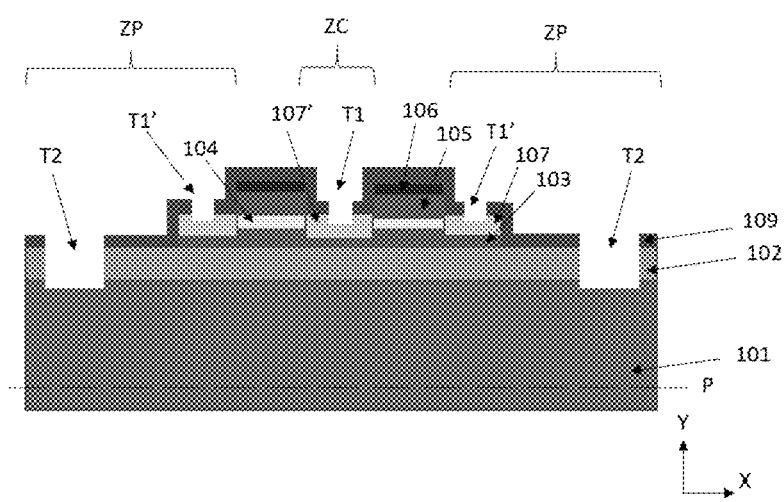
FIG. 17 illustrates the eighth step of the fourth embodiment of the method according to the invention.
Figure 18:
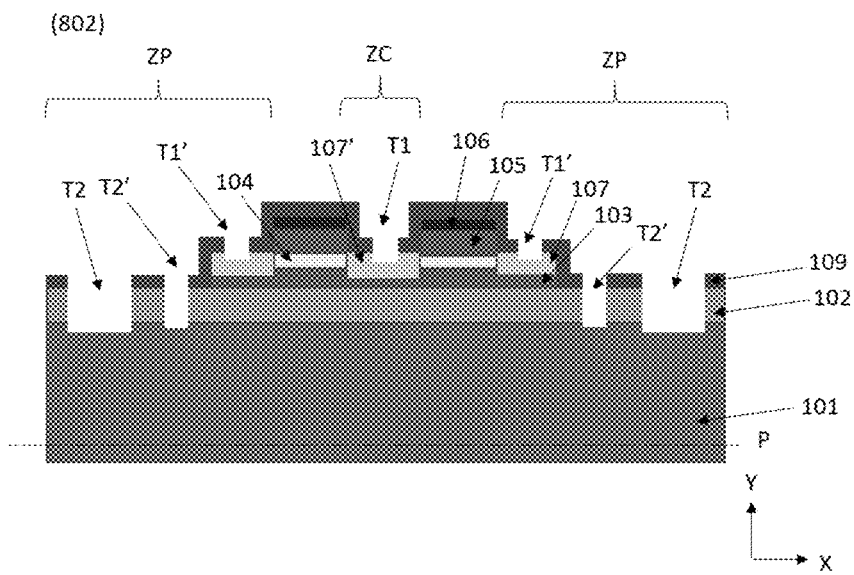
FIG. 18 illustrates the ninth step of the fourth embodiment of the method according to the invention.

FIG. 17 The eighth step 508 is also carried out in the method 800 according to the fourth embodiment, after a step 801 illustrated in FIG. 17 and a step 802 illustrated in FIG. 18.

Step 801 illustrated in FIG. 17 consists in etching two primary trenches T1' in the electrode insulating layer 109 and in a part of the fourth semiconductor layer 104, or failing this of the third semiconductor layer 103 doped during the third step 503, at the level of the second lines L2. The primary trenches T1' are parallel to the first lines L1 in the layer plane P.

The primary trenches T1' are parallel with each other. A primary trench T1' is etched in such a way that the edges of this primary trench T1' are substantially of same height and that the sides of the primary trench T1' are comprised in planes orthogonal to the bottom of the primary trench T1' and substantially parallel with each other. The etching depth is substantially the same for the two primary trenches T1'.

The etching following a step of photo-lithography may be carried out by fluorine plasma dry etching.

The two primary trenches T1' have for example a width of 0.5 µm to 10 µm.

FIG. 18 Step 802 illustrated in FIG. 18 consists in etching two secondary trenches T2' with stoppage on the first semiconductor layer 101 along the two second lines L2, that is to say in the peripheral zones ZP. The secondary trenches T2' are parallel to the first lines L1 in the layer plane P.

The secondary trenches T2' are parallel with each other. A secondary trench T2' is etched in such a way that the edges of this secondary trench T2' are substantially of same height and that the sides of the secondary trench T2' are comprised in planes orthogonal to the bottom of the secondary trench T2' and substantially parallel with each other. The etching depth is substantially the same for the two secondary trenches T2'.

The etching following a step of photo-lithography may be carried out by fluorine plasma dry etching.

The two secondary trenches T2' have for example a width of 0.5 µm to 10 µm.

Figure 9:
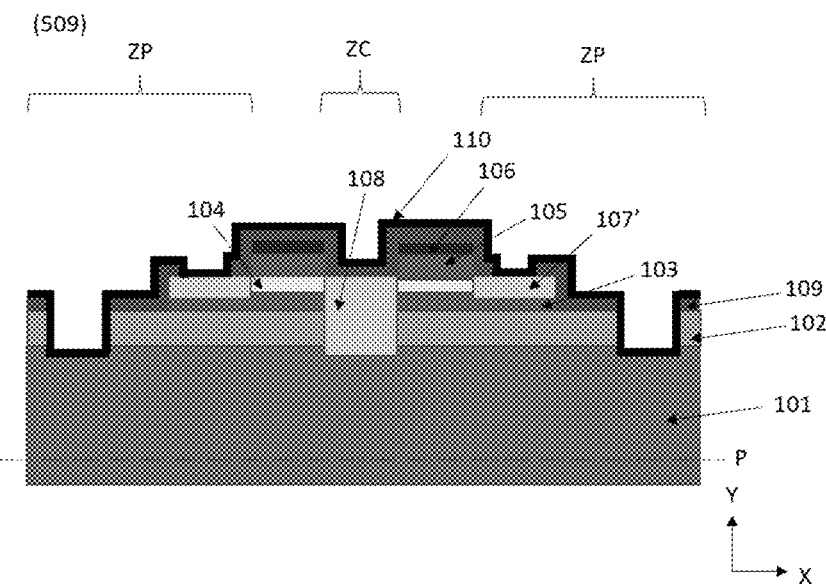
FIG. 9 illustrates the ninth step of the first embodiment of the method according to the invention.

FIG. 9 illustrates a ninth step 509 of the method 500 according to the first embodiment.

The ninth step 509 consists in carrying out a conformal deposition of an electrode metal layer 110.

The deposition is for example carried out by epitaxy, by CVD (Chemical Vapour Deposition) or instead by ALD (Atomic Layer Deposition).

The electrode metal layer 110 is for example made of TiN or Ti and has a thickness comprised between 50 nm and 100 nm.

The ninth step 509 is also carried out in the method 700 according to the third embodiment and in the method 800 according to the fourth embodiment after the eighth step 508.

Figure 12:
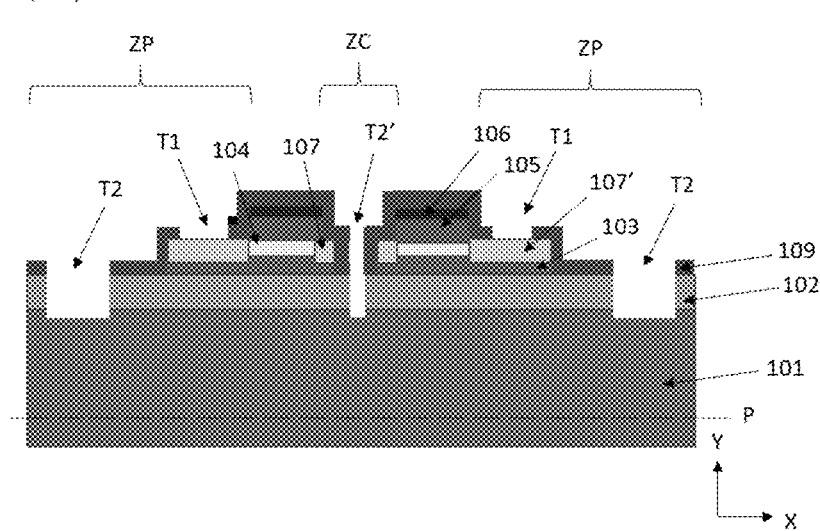
FIG. 12 illustrates the tenth step of the second embodiment of the method according to the invention.
Figure 13:
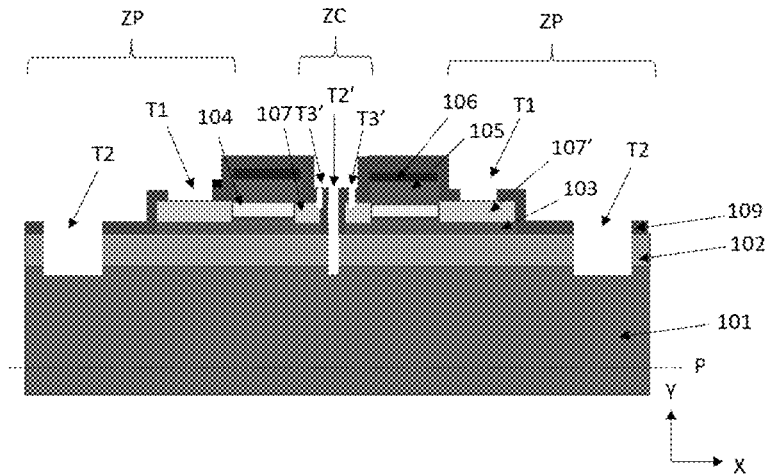
FIG. 13 illustrates the eleventh step of the second embodiment of the method according to the invention.

FIG. 12 The ninth step 509 is also carried out in the method 600 according to the second embodiment, after a step 602 illustrated in FIG. 12 and a step 603 illustrated in FIG. 13.

The step 602 illustrated in FIG. 12 consists in etching a secondary trench T2' in the primary trench etched at step 601 illustrated in FIG. 11 with stoppage in the first semiconductor layer 101. The secondary trench T2' is parallel to the first lines L1 in the layer plane P.

A secondary trench T2' is etched in such a way that the edges of this secondary trench T2' are substantially of same height and that the sides of the secondary trench T2' are comprised in planes orthogonal to the bottom of the secondary trench T2' and substantially parallel with each other.

The etching following a step of photo-lithography may be carried out by fluorine plasma dry etching.

The secondary trenches T2' have for example a width of 0.5 µm to 10 µm.

FIG. 13 Step 603 illustrated in FIG. 13 consists in etching at least two tertiary trenches T3' in the central zone on either side of the primary trench T1' etched at step 601. The tertiary trenches T3' are parallel to the first lines L1 in the layer plane P.

A tertiary trench T3' is etched in such a way that the edges of this tertiary trench T3' are substantially of same height and that the sides of the tertiary trench T3' are comprised in planes orthogonal to the bottom of the tertiary trench T3' and substantially parallel with each other.

The etching following a step of photo-lithography may be carried out by fluorine plasma dry etching.

The tertiary trenches T3' have for example a width of 0.5 µm to 10 µm.

Figure 10:
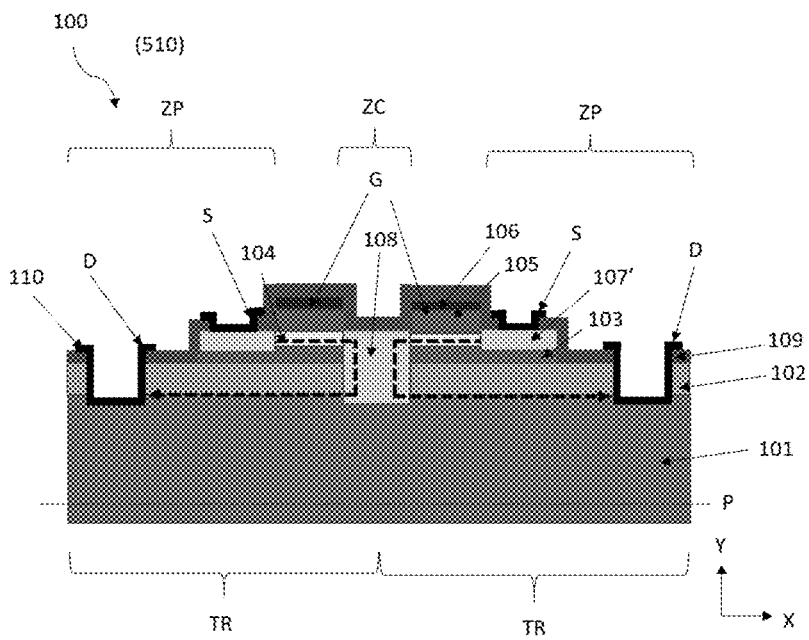
FIG. 10 illustrates the tenth step of the first embodiment of the method according to the invention.

FIG. 10 illustrates a tenth step 510 of the method 500 according to the first embodiment.

The tenth step 510 consists in etching the electrode metal layer 110 so as to conserve the electrode metal layer 110 at the level of the trenches T1, T2, T1', T2' previously etched.

The tenth step 510 is also carried out in the method 600, 700, 800 according to the second, third and fourth embodiments after the ninth step 509.

Thus, at the end of the tenth step 510, the parts of the electrode metal layer 110 located in the first trenches T1 become the source electrodes S, the parts of the electrode metal layer 110 located in the second trenches T2 become the drain electrodes D and the parts of the electrode metal layer 110 located in the optional primary T1', secondary T2' and tertiary T3' trenches, become one or more second metal zones 201, 401, 402.

In FIGS. 10, 14, 16 and 17 is represented the conduction path of electrons between the source electrode S and the drain electrode D for the device 100, 200, 300, 400 respectively according to the first, second, third and fourth embodiments in the on state.

It is observed that, unlike conventional electron gas transistors, the conduction path is not rectilinear and electrons coming from the source electrode S traverse the second semiconductor layer 102 via a second zone 108, 201, 401 to join the drain electrode D.

Figure 25:
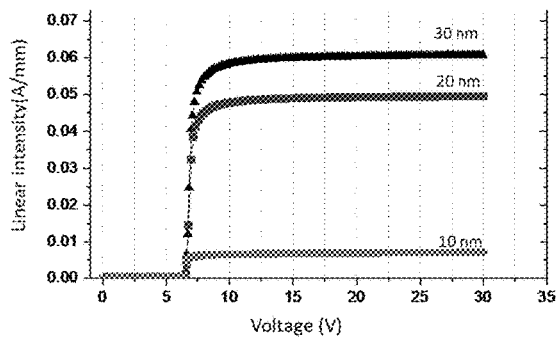
FIG. 25 represents the characteristics of a transistor according to the invention in its on state as a function of the thickness of a second semiconductor layer.

FIG. 25 represents the characteristics of a transistor TR according to the invention in its on state as a function of the thickness of the second semiconductor layer 102.

It is observed that the greater the thickness of the second semiconductor layer 102, the lower the resistance of the transistor TR in its on state. For a thickness of 30 nm, the desired characteristic for the on state is found as illustrated in FIG. 24.

Figure 26:
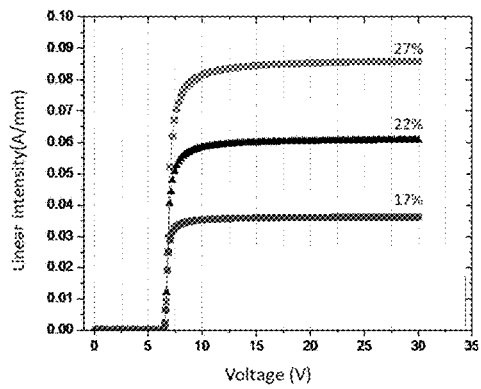
FIG. 26 represents the characteristics of a transistor according to the invention in its on state as a function of the percentage aluminium in a second semiconductor layer.

FIG. 26 represents the characteristics of a transistor TR according to the invention in its on state as a function of the percentage aluminium Al in the second semiconductor layer 102 made of aluminium gallium nitride.

It is observed that the higher the percentage of aluminium, the lower the resistance of the transistor TR in its on state. For a percentage aluminium of 22%, the characteristic desired for the on state is found as illustrated in FIG. 24.

Figure 27:
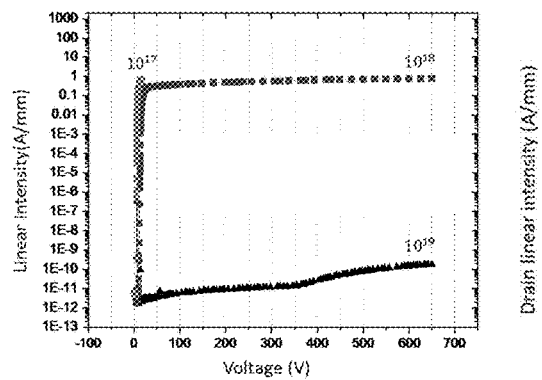
FIG. 27 represents the characteristics of a transistor according to the invention in its off state as a function of the P type doping in a third semiconductor layer.

FIG. 27 represents the characteristics of a transistor TR according to the invention in its off state as a function of the concentration of dopants in the third semiconductor layer 103.

It is observed that the higher the concentration of dopants, the higher the resistance of the transistor TR in its off state and thus the higher the threshold voltage. For a concentration of dopants of $10^{19}$ cm$^{-3}$, the desired characteristic for the off state is found as illustrated in FIG. 24.

The resistance of the transistor TR in the on state may thus be adjusted by means of the characteristics of the second semiconductor layer 102 and the resistance in the off state and thus the threshold voltage, by means of the characteristics of the third semiconductor layer 103.

Thus, the resistance of the transistor TR in its on state is decorrelated from its threshold voltage, unlike conventional electron gas transistors in which the characteristics of the second semiconductor layer 102 also impact the resistance in the off state.

Figure 28:
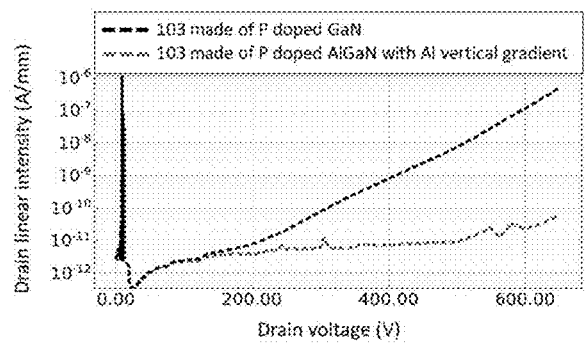
FIG. 28 represents the leakage current of a transistor according to the invention having a third semiconductor layer made of P doped gallium nitride GaN and a transistor according to the invention having a third semiconductor layer made of P doped aluminium gallium nitride AlGaN with a vertical gradient of aluminium.

FIG. 28 represents in black dotted lines the leakage current of a transistor TR according to the invention having a third semiconductor layer made of P doped gallium nitride GaN and in red dotted lines the leakage current of a transistor TR according to the invention having a third semiconductor layer made of P doped aluminium gallium nitride AlGaN with a gradient of aluminium along the vertical axis Y having a first molar fraction of aluminium equal to 0.2 and a second zero molar fraction of aluminium. In both cases, the third semiconductor layer is doped with magnesium Mg with a concentration of dopants of the order of $5\times10^{18}$ cm$^{-3}$.

It is observed that the leakage current in the transistor TR having a third semiconductor layer made of P doped aluminium gallium nitride AlGaN with a vertical gradient of aluminium is below the leakage current in the transistor TR according to the invention having a third semiconductor layer made of P doped gallium nitride GaN.

The one-piece device according to the second aspect of the invention may further comprise a Schottky diode integrated in parallel with each transistor TR.

Figure 31:
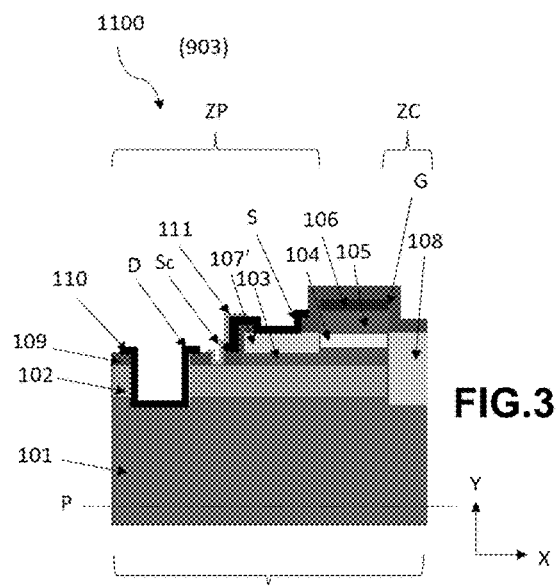
FIG. 31 illustrates the thirteenth step of the first alternative embodiment of the fifth embodiment of the method according to the invention.

FIG. 31 shows a schematic representation of a first alternative embodiment of a transistor TR of a fifth embodiment of the device 1100 according to the invention, integrating a Schottky diode.

Figure 34:
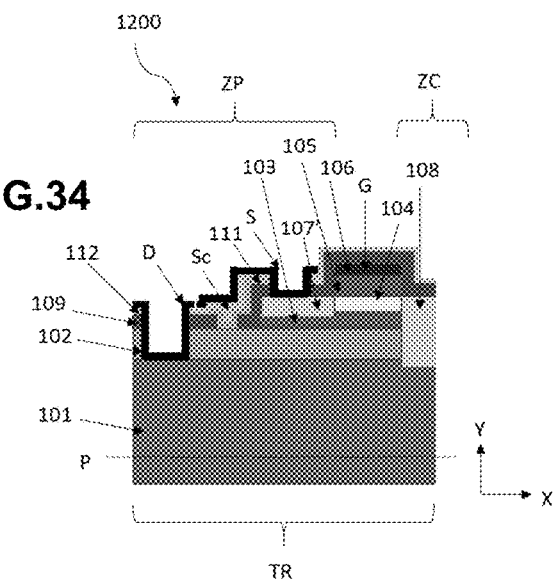
FIG. 34 shows a schematic representation of a first alternative embodiment of the sixth embodiment of the device according to the invention.

FIG. 34 shows a schematic representation of a first alternative embodiment of a transistor TR of a sixth embodiment of the device 1200 according to the invention, integrating a Schottky diode.

Figure 38:
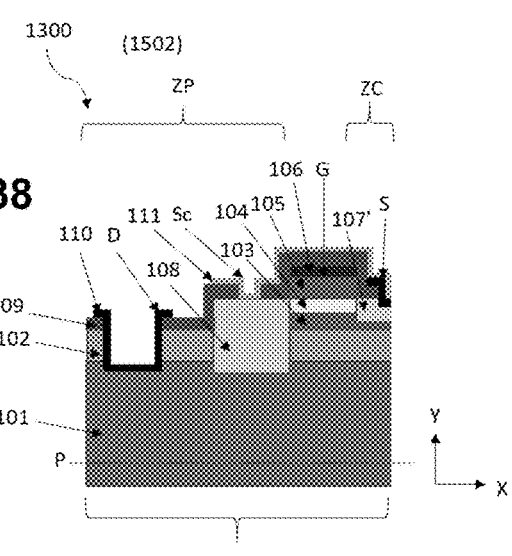
FIG. 38 illustrates the twelfth step of a seventh embodiment of the method according to the invention.

FIG. 38 shows a schematic representation of a transistor TR of a seventh embodiment of the device 1300 according to the invention, integrating a Schottky diode.

FIG. 40 shows a schematic representation of a transistor TR of an eighth embodiment of the device 1400 according to the invention, integrating a Schottky diode.

Figure 35:
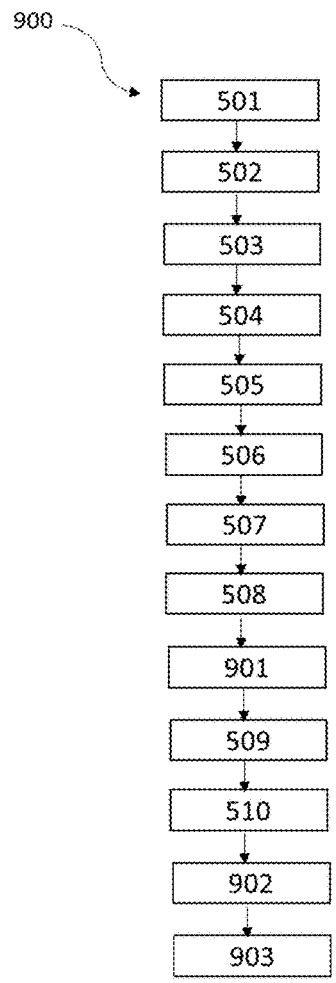
FIG. 35 is a synoptic diagram illustrating the steps of the first alternative embodiment of the fifth embodiment of the method according to the invention.

FIG. 35 is a synoptic diagram illustrating the steps of a first alternative embodiment of the fifth embodiment of the method 900 according to the invention making it possible to obtain the first alternative embodiment of the fifth embodiment of the device 1100 according to the invention.

The fifth embodiment of the method 900 according to the invention further comprises three steps compared to the first embodiment 500, or to the second embodiment 600 of the method according to the invention.

The first alternative embodiment of the fifth embodiment of the device 1100 according to the invention makes it possible to obtain the fifth embodiment of the device 1100 according to the invention from the first embodiment of the device 100 according to the invention. The same teachings could be applied to obtain a second alternative embodiment of the fifth embodiment of the device 1100 according to the invention from the second embodiment of the device 200 according to the invention.

The fifth embodiment of the method 900 according to the invention comprises the eight first steps 501, 502, 503, 504, 505, 506, 507, 508 of the first embodiment of the method 500 according to the invention.

Figure 29:
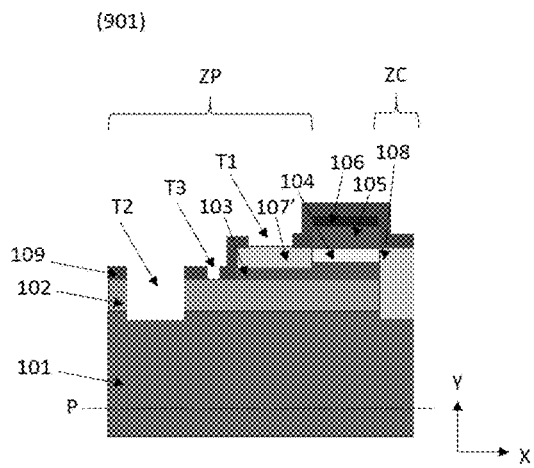
FIG. 29 illustrates the ninth step of a first alternative embodiment of the fifth embodiment of the method according to the invention.

FIG. 29 illustrates a ninth step 901 of the first alternative embodiment of the fifth embodiment of the method 900 according to the invention.

The ninth step 901 could be carried out before steps 507 and 508 of etching the first trenches T1 and the second trenches T2.

The ninth step 901 consists in etching two third parallel trenches T3 in the electrode insulating layer 109, at the level of the peripheral zones ZP situated on either side of the two second lines L2 in such a way that the second lines L2 are between the two third trenches T3.

Each third trench T3 is between a first trench T1 and a second trench T2.

The third trenches T3 are parallel to the first trenches T1 and to the second trenches T2.

The etching following a step of photo-lithography may be carried out by fluorine plasma dry etching.

The ninth step 901 is followed by the ninth step 509 and the tenth step 510 of the first embodiment of the method 500 according to the invention, corresponding respectively to the tenth and eleventh step of the first alternative embodiment of the fifth embodiment of the method 900 according to the invention, the electrode etching carried out during the tenth step 510 further conserving the electrode metal layer 110 between each third trench T3 etched at the ninth step 901 and the first trench T1 the closest to the considered third trench T3.

The tenth step 510 of the first embodiment of the method 500 according to the invention is followed by a twelfth step and a thirteenth step in the method 900.

Figure 30:
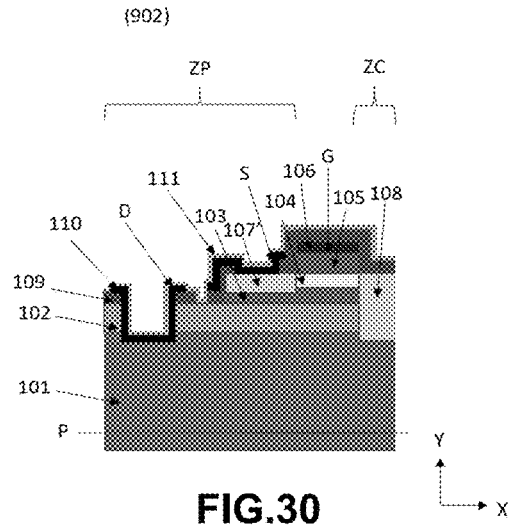
FIG. 30 illustrates the twelfth step of the first alternative embodiment of the fifth embodiment of the method according to the invention.

FIG. 30 illustrates the twelfth step 902 of the first alternative embodiment of the fifth embodiment of the method 900 according to the invention.

FIG. 31 illustrates the thirteenth step 903 of the first alternative embodiment of the fifth embodiment of the method 900 according to the invention.

The twelfth step 902 consists in depositing a diode metal layer 111 along the layer plane P.

The deposition is for example carried out by CVD (Chemical Vapour Deposition) or by sputtering.

The diode metal layer 111 is for example made of Ni or Ni—Au and has a thickness comprised between 10 nm and 500 nm.

The thirteenth step 903 consists in etching the diode metal layer 111 so as to conserve at least the diode metal layer 111 at the level of each third trench T3 etched at the ninth step 901 and between each third trench T3 and the first trench T1 the closest to the considered third trench T3.

The remaining diode metal layer 111 constitutes a Schottky diode Sc.

At the end of the thirteenth step 903, the first alternative embodiment of the fifth embodiment of the device 1100 according to the invention is obtained.

Figure 36:
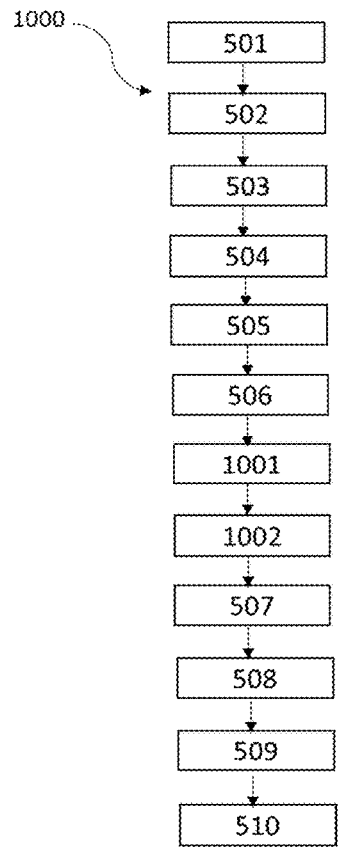
FIG. 36 is a synoptic diagram illustrating the steps of the first alternative embodiment of the sixth embodiment of the method according to the invention.

FIG. 36 is a synoptic diagram illustrating the steps of a first alternative embodiment of the sixth embodiment of the method 1000 according to the invention making it possible to obtain the first alternative embodiment of the sixth embodiment of the device 1200 according to the invention.

The sixth embodiment of the method 1000 according to the invention further comprises two steps compared to the first embodiment 500, or to the second embodiment 600 of the method according to the invention.

The first alternative embodiment of the sixth embodiment of the device 1200 according to the invention makes it possible to obtain the sixth embodiment of the device 1200 according to the invention from the first embodiment of the device 100 according to the invention. The same teachings could be applied to obtain a second alternative embodiment of the sixth embodiment of the device 1100 according to the invention from the second embodiment of the device 200 according to the invention.

The sixth embodiment of the method 1000 according to the invention comprises the six first steps 501, 502, 503, 504, 505, 506, of the first embodiment of the method 500 according to the invention.

Figure 32:
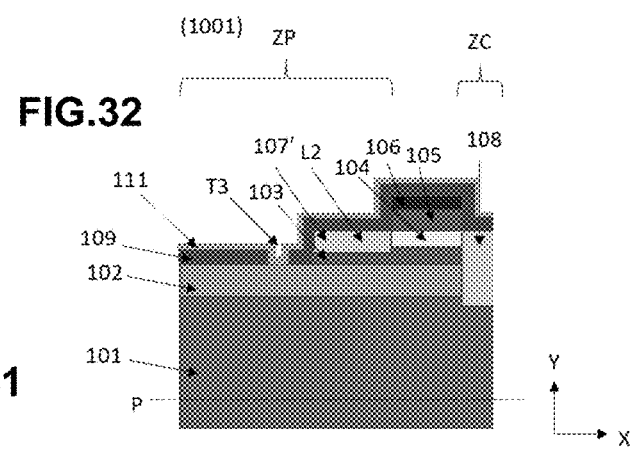
FIG. 32 illustrates the seventh step of a first alternative embodiment of the sixth embodiment of the method according to the invention.
Figure 33:
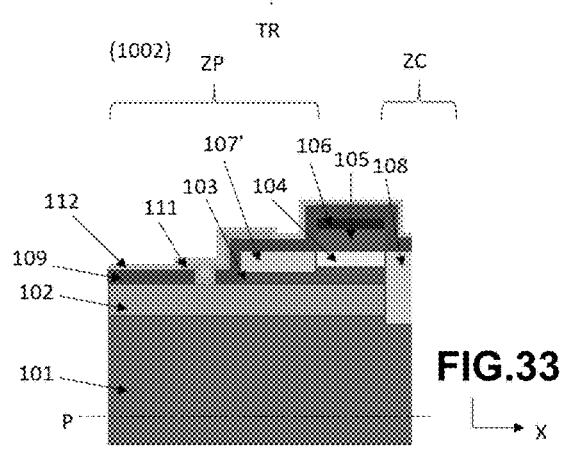
FIG. 33 illustrates the eighth step of the first alternative embodiment of the sixth embodiment of the method according to the invention.

FIG. 32 illustrates a seventh step 1001 of the first alternative embodiment of the sixth embodiment of the method 1000 according to the invention.

The seventh step 1001 consists in etching two third parallel trenches T3 in the electrode insulating layer 109, at the level of the peripheral zones ZP situated on either side of the two second lines L2 in such a way that the second lines L2 are between the two third trenches T3.

The etching following a step of photo-lithography may be carried out by fluorine plasma dry etching.

The seventh step 1001 next consists in depositing a diode metal layer 111 along the layer plane P.

The deposition is for example carried out by CVD (Chemical Vapour Deposition) or by sputtering.

The diode metal layer 111 is for example made of Ni or Ni—Au and has a thickness comprised between 10 nm and 500 nm.

FIG. 32 illustrates the eighth step 1002 of the first alternative embodiment of the sixth embodiment of the method 1000 according to the invention.

The eighth step 1002 consists in etching the diode metal layer 111 so as to conserve at least the diode metal layer 111 at the level of each third trench T3, between each third trench T3 and the second line L2 the closest to the considered third trench T3 and at the level of each second line L2.

The eighth step 1002 next consists in depositing a diode insulating layer 112 along the layer plane P.

The electrode diode insulating layer 112 is for example made of silicon nitride SiN and has for example a thickness comprised between 10 and 500 nm.

The electrode diode insulating layer 112 is for example obtained by LPCVD of a strain of SiN.

The eighth step 1002 is followed by the seventh step 507, the eighth step 508, the ninth step 509 and the tenth step 510 of the first embodiment of the method 500 according to the invention, corresponding respectively to the ninth, tenth, eleventh and twelfth steps of the first alternative embodiment of the sixth embodiment of the method 1000 according to the invention, the second trenches T2 being etched in such a way that the third trenches T3 are between the second trenches T2 and the electrode etching carried out during the tenth step 510 further conserving the electrode metal layer 110 in each third trench T3 and between each third trench T3 and the first trench T1 the closest to the considered third trench T3.

At the end of the method 1000, each third trench T3 is between a first trench T1 and a second trench T2 and the third trenches T3 are parallel to the first trenches T1 and to the second trenches T2.

At the end of the twelfth step 510, the first alternative embodiment of the sixth embodiment of the device 1200 according to the invention illustrated in FIG. 34 is obtained, the remaining diode metal layer 111 covered with the electrode metal layer 110 constituting a Schottky diode Sc.

FIG. 41 is a synoptic diagram illustrating the steps of the seventh embodiment of the method 1500 according to the invention making it possible to obtain the seventh embodiment of the device 1300 according to the invention.

The seventh embodiment of the method 1500 according to the invention further comprises two steps compared to the third embodiment 700 of the method according to the invention.

The seventh embodiment of the device 1300 according to the invention makes it possible to obtain the seventh embodiment of the device 1300 according to the invention from the third embodiment of the device 300 according to the invention.

The seventh embodiment of the method 1500 according to the invention comprises the ten steps 501, 502, 503, 504, 505, 506, 701, 508, 509, 510 of the third embodiment of the method 700 according to the invention.

Figure 37:
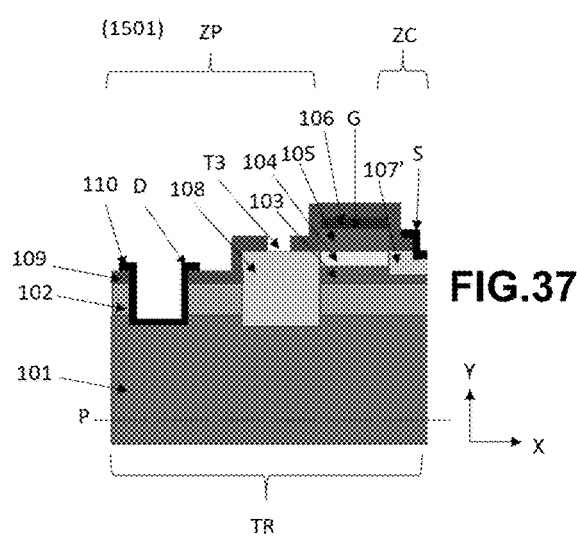
FIG. 37 illustrates the eleventh step of a seventh embodiment of the method according to the invention.

FIG. 37 illustrates the eleventh step 1501 of the seventh embodiment of the method 1500 according to the invention.

The eleventh step 1501 consists in etching two third parallel trenches T3 in such a way that each third trench is etched at the level of a second line L2.

Each third trench T3 is between the first trench T1 and a second trench T2 and the third trenches T3 are parallel to the first trench T1 and to the second trenches T2.

The etching following a step of photo-lithography may be carried out by fluorine plasma dry etching.

FIG. 38 illustrates the twelfth step 1502 of the seventh embodiment of the method 1500 according to the invention.

The twelfth step 1502 consists in depositing a diode metal layer 111 along the layer plane P.

The deposition is for example carried out by CVD (Chemical Vapour Deposition) or by sputtering.

The diode metal layer 111 is for example made of Ni or Ni—Au and has a thickness comprised between 10 nm and 500 nm.

The twelfth step 1502 next consists in etching the diode metal layer 111 so as to conserve at least the diode metal layer 111 at the level of each second line L2, between each third trench T3 and the first trench T1 and at the level of the first trench T1.

At the end of the twelfth step 1502, the seventh embodiment of the device 1300 according to the invention illustrated in FIG. 38 is obtained, the remaining diode metal layer 111 constituting a Schottky diode Sc.

FIG. 42 is a synoptic diagram illustrating the steps of the eighth embodiment of the method 1600 according to the invention making it possible to obtain the eighth embodiment of the device 1400 according to the invention.

The eighth embodiment of the method 1600 according to the invention further comprises two steps compared to the fourth embodiment of the method 800 according to the invention.

The eighth embodiment of the device 1400 according to the invention makes it possible to obtain the eighth embodiment of the device 1400 according to the invention from the fourth embodiment of the device 400 according to the invention.

The eighth embodiment of the method 1600 according to the invention comprises the twelve steps 501, 502, 503, 504, 505, 506, 701, 801, 802, 508, 509, 510 of the fourth embodiment of the method 800 according to the invention.

FIG. 39 illustrates the thirteenth step 1601 of the eighth embodiment of the method 1600 according to the invention.

The thirteenth step 1601 consists in depositing a diode insulating layer 112 along the layer plane P.

The diode electrode insulating layer 112 is for example made of silicon nitride SiN and has for example a thickness comprised between 10 and 500 nm.

The diode electrode insulating layer 112 is for example obtained by LPCVD of a strain of SiN.

The thirteenth step 1601 next consists in etching two third parallel trenches T3 in such a way that each third trench is etched between a second trench T2 and a secondary trench T2'.

The third trenches T3 are parallel to the first trench T1, to the primary trenches T1', to the secondary trenches T2' and to the second trenches T2.

The etching following a step of photo-lithography may be carried out by fluorine plasma dry etching.

FIG. 40 illustrates the fourteenth step 1602 of the eighth embodiment of the method 1600 according to the invention.

The fourteenth step 1602 consists in depositing a diode metal layer 111 along the layer plane P.

The deposition is for example carried out by CVD (Chemical Vapour Deposition) or by sputtering.

The diode metal layer 111 is for example made of Ni or Ni—Au and has a thickness comprised between 10 nm and 500 nm.

The fourteenth step 1602 next consists in etching the diode metal layer 111 so as to conserve at least the diode metal layer 111 at the level of each third trench T3, between each third trench T3 and the first trench T1 and at the level of the first trench T1.

At the end of the fourteenth step 1602, the eighth embodiment of the device 1400 according to the invention illustrated in FIG. 40 is obtained, the remaining diode metal layer 111 constituting a Schottky diode Sc.

The invention claimed is:

1. Electron gas transistor of normally open type, comprising:
   a first semiconductor layer laid out along a layer plane and a second semiconductor layer formed on the first semiconductor layer and laid out along the layer plane, the first and second semiconductor layers forming an electron gas layer at the interface thereof;
   a third semiconductor layer with P type doping formed on the second semiconductor layer and laid out along the layer plane,
   at least one first zone with N type doping of which at least one part is arranged within the thickness of the third semiconductor layer, the first zone delimiting a source zone;
   at least one second zone with N or metal type doping having at least one part arranged in the second semiconductor layer;
   a source electrode formed on the source zone;
   a drain electrode formed on the first semiconductor layer; and
   a gate located between the source electrode and the second zone.

2. The transistor according to claim 1, further comprising a fourth semiconductor layer on the third semiconductor layer laid out along the layer plane, the source zone and at least one part of the second zone being arranged within the thickness of the fourth semiconductor layer.

3. The transistor according to claim 2, wherein the fourth semiconductor layer is a layer of intrinsic gallium nitride GaN.

4. The transistor according to claim 1, wherein the first semiconductor layer is a layer of gallium nitride GaN and the second semiconductor layer is a layer of aluminium gallium nitride AlGaN.

5. The transistor according to claim 4, wherein the level of aluminium in the second semiconductor layer is greater than 20%.

6. The transistor according to claim 1, wherein the second semiconductor layer has a thickness greater than 20 nm.

7. The transistor according to claim 1, wherein the third semiconductor layer is a layer of gallium nitride GaN doped with magnesium Mg with a concentration of dopants of the order of $10^{17}$ or $10^{18}$ cm$^{-3}$.

8. The transistor according to claim 1, wherein the third semiconductor layer is an aluminium gallium nitride layer AlGaN doped with magnesium Mg with a concentration of dopants of the order of $10^{17}$ or $10^{18}$ cm$^{-3}$ with a gradient of aluminium along an axis perpendicular to the layer plane, going from a first molar fraction of aluminium for the part of the third semiconductor layer in contact with the second semiconductor layer to a second molar fraction of aluminium less than the first molar fraction of aluminium.

9. The transistor according to claim 1, wherein the first zone is doped with silicon Si with a concentration of dopants of the order of $10^{19}$ cm$^{-3}$ to $10^{20}$ cm$^{-3}$ and has a thickness comprised between 10 nm and 100 nm.

10. The transistor according to claim 1, wherein the second zone with N type doping is doped with silicon Si with a concentration of dopants of the order of $10^{20}$ cm$^{-3}$.

11. The transistor according to claim 1, wherein the third semiconductor layer has a thickness comprised between 50 and 200 nm.

12. The transistor according to claim 1, wherein the second zone has at least one part arranged within the thickness of the third, second and first semiconductor layers.

13. The transistor according to claim 1, wherein a first second metal zone has at least one part arranged within the thickness of the second and first semiconductor layers and a second second metal zone situated between the source electrode and the first second zone has at least one part arranged in a first zone.

14. One-piece device comprising at least two transistors according to claim 1, arranged in cascode.

15. The one-piece device according to claim 14, further comprising a Schottky diode integrated in parallel with each transistor.

16. Method for manufacturing a device according to claim 14, comprising:
  depositing along a layer plane, a first then a second then a third semiconductor layer then a gate insulating layer and then a gate metal layer;
  etching the gate insulating layer and the gate metal layer so as to obtain two first parallel and non-merged lines in the layer plane;
  doping at least the third semiconductor layer at the level of a plurality of peripheral zones situated on either side of the two first parallel and non-merged lines and laid out along the layer plane;
  doping at least the third semiconductor layer at the level of a central zone situated between the two first parallel and non-merged lines and laid out along the layer plane;
  etching the peripheral zones with stoppage on the second semiconductor layer so as to conserve a second line along each first parallel and non-merged line;
  depositing an electrode insulating layer along the layer plane;
  etching two second parallel trenches with stoppage on or in the first semiconductor layer in the peripheral zones situated on either side of the two second lines, the second lines being between the two second parallel trenches;
  depositing an electrode metal layer along the layer plane;
  etching, called electrode etching, the electrode metal layer so as to conserve at least the electrode metal layer at the level of the second parallel trenches.

17. The method according to claim 16, further comprising an etching of a first trench in the electrode insulating layer at the level of each second line, the electrode etching conserving the electrode metal layer at the level of the two first trenches.

18. The method according to claim 17, further comprising:
  etching a primary trench in the central zone before the step of depositing the electrode insulating layer;
  etching a secondary trench in the primary trench with stoppage in the first semiconductor layer after the step of depositing the electrode insulating layer,
  etching at least two tertiary trenches in the central zone on either side of the primary trench after the step of depositing the electrode insulating layer;
the electrode etching conserving the electrode metal layer at the level of the primary, secondary and tertiary trenches.

19. The method according to claim 16, further comprising, after the step of depositing the electrode insulating layer, an etching of a first trench in the central zone, the electrode etching conserving the electrode metal layer at the level of the first trench.

20. The method according to claim 19, further comprising the following steps, after the step of depositing the electrode insulating layer:
  etching a primary trench in at least the electrode insulating layer at the level of each second line;
  etching a secondary trench with stoppage on the first semiconductor layer along each second line,
the electrode etching conserving the electrode metal layer at the level of the two primary trenches and two secondary trenches.

21. The method for manufacturing according to claim 17, comprising, after the step of depositing the electrode insulating layer, a step of etching two third parallel trenches in the electrode insulating layer, in the peripheral zones situated on either side of the two second lines, the second lines being between the two third trenches, the second trenches being etched in such a way that the third trenches are between the second trenches, the electrode etching further conserving the electrode metal layer between each third trench and the closest first trench and after the step of electrode etching, the following steps:
  depositing a diode metal layer along the layer plane;
  etching the diode metal layer so as to conserve at least the diode metal layer at the level of each third trench and between each third trench and the closest first trench.

22. The method for manufacturing according to claim 17, further comprising, after the step of depositing the electrode insulating layer, the following steps:
  etching two third parallel trenches in the electrode insulating layer, in the peripheral zones situated on either side of the two second lines, the second lines being between the two third trenches, then depositing a diode metal layer along the layer plane;
  etching the diode metal layer so as to conserve at least the diode metal layer at the level of each third trench, between each third trench and the closest second line and at the level of each second line, then depositing a diode insulating layer along the layer plane;
the second trenches being etched in such a way that the third trenches are between the second trenches, the electrode etching further conserving the electrode metal layer at the level of each third trench and between each third trench and the closest first trench.

23. The method for manufacturing according to claim 19, further comprising, after the step of electrode etching, the following steps:
- etching two third parallel trenches, each third trench being etched at the level of a second line;
- depositing a diode metal layer along the layer plane and etching the diode metal layer so as to conserve at least the diode metal layer at the level of each second line, between each third trench and the first trench and at the level of the first trench.

24. The method for manufacturing according to claim 20, further comprising, after the step of electrode etching, the following steps:
- depositing a diode insulating layer along the layer plane and etching two third parallel trenches, each third trench being etched between a second trench and a secondary trench;
- depositing a diode metal layer along the layer plane and etching the diode metal layer so as to conserve at least the diode metal layer at the level of each third trench, between each third trench and the first trench and at the level of the first trench.

\* \* \* \* \*